United States Patent
Stephens et al.

(10) Patent No.: US 6,388,782 B1
(45) Date of Patent: May 14, 2002

(54) MULTI-WAVELENGTH DENSE WAVELENGTH DIVISION MULTIPLEXED OPTICAL SWITCHING SYSTEMS

(75) Inventors: William Edward Stephens, Belle Mead; Joseph Hy Abeles, Highland Park; John Charles Connolly, Clarksburg, all of NJ (US)

(73) Assignee: Sarnoff Corporation, Princeton, NJ (US)

( * ) Notice: Subject to any disclaimer, the term of this patent is extended or adjusted under 35 U.S.C. 154(b) by 0 days.

(21) Appl. No.: 09/190,675

(22) Filed: Nov. 12, 1998

Related U.S. Application Data

(63) Continuation-in-part of application No. 09/184,906, filed on Nov. 3, 1998, now Pat. No. 6,014,237.
(60) Provisional application No. 60/087,522, filed on Jun. 1, 1998, and provisional application No. 60/093,358, filed on Jul. 20, 1998.

(51) Int. Cl.[7] .............................................. H04J 14/02
(52) U.S. Cl. ......................... 359/124; 359/128; 372/18
(58) Field of Search ................................. 359/124, 127, 359/178; 372/18

(56) References Cited

U.S. PATENT DOCUMENTS

| | | | |
|---|---|---|---|
| 3,849,604 A | 11/1974 | Benes et al. | 179/15 |
| 4,807,227 A | 2/1989 | Fujiwara | 370/3 |
| 4,873,681 A | 10/1989 | Arthurs et al. | 370/3 |
| 4,945,531 A | 7/1990 | Suzuki | 370/3 |
| 5,005,167 A | 4/1991 | Arthurs et al. | 370/4 |
| 5,113,459 A | 5/1992 | Grasso et al. | 385/24 |
| 5,121,381 A | 6/1992 | Takahashi et al. | 359/117 |

(List continued on next page.)

OTHER PUBLICATIONS

Bellcore Technical Reference TR–NWT–000468, Reliability Assurance Practices for Optoelectronic Devices in Interoffice Applications (Bellcore, Livingston, NJ).

Cundiff et al., "Effect of fiber nonlinearity on the propagation of highly chirped pulses in a WDM system," *OFC '98 Technical Digest*, Friday Morning, pp. 397–398.

Paper by Peter J. Delfyett, et al, "20 ×5Gbit/s optical WDM transmitter using a single–stripe multiwavelength mod-elocked semiconductor laser," pp. 1–10.

K. Hall, et al., "CMA2, Interferometric All–Optical Switching Using Nonlinearities in Semiconductor Optical Amplifiers Biased at Transparency," 1998 Conference on Lasers and Electro–Optics and published in the Optical Society of America.

Shi, et al., presentation entitled "Four–Wavelength, 10–Ghz Picosecond Pulse Generation From an Active Mode–Locked Single–Stripe Diode Laser," given May 20, 1997 at the 1997 Conference on Lasers and Electro–Optics.

M.R. Amersfoort et al., "Morolther Multilength Lasers for WDM Systems" SPIE vol. 3006, pp. 134–144 1997.

*Primary Examiner*—Kinfe-Michael Negash
(74) *Attorney, Agent, or Firm*—William J. Burke

(57) ABSTRACT

A wavelength division multiplex optical crossconnect system and add/drop multiplexer including a dense wavelength division multiplexed (DWDM) source which preferably includes a multiwavelength mode-locked (MWML) external cavity laser as a fundamental sub-circuit for optically crossconnecting several multi-wavelength data channels onto similar data channels having an interchanged set of optical wavelengths. The optical crossconnect architecture allows the rearrangement of multiple logical channels in a timely manner to support protection switching, traffic grooming, and other telecommunications network functions. The crossconnect architecture further supports multiple physical fibers into and out of the crossconnect, where each fiber carries multiple logical channels on multiple wavelengths of light which are assigned particular wavelength carriers, crossconnected onto any other physical fiber, and assigned another wavelength carrier. The add/drop multiplexer provides a completely optical passthrough for received optical signals.

30 Claims, 17 Drawing Sheets

U.S. PATENT DOCUMENTS

| | | | |
|---|---|---|---|
| 5,140,456 A | 8/1992 | Huber | 359/341 |
| 5,166,281 A | 11/1992 | Huber | 359/238 |
| 5,194,977 A | 3/1993 | Nishio | 359/128 |
| 5,208,691 A | 5/1993 | Nishio | 359/123 |
| 5,222,089 A | 6/1993 | Huber | 372/26 |
| 5,278,686 A | 1/1994 | Grasso et al. | 359/110 |
| 5,282,079 A | 1/1994 | Laming et al. | 359/341 |
| 5,283,686 A | 2/1994 | Huber | 359/337 |
| 5,321,540 A | 6/1994 | Takai et al. | 359/124 |
| 5,347,525 A | 9/1994 | Faris | 372/19 |
| 5,347,527 A | 9/1994 | Favre et al. | 372/20 |
| 5,488,500 A | 1/1996 | Glance | 359/127 |
| 5,493,433 A | 2/1996 | Prucnal et al. | 359/123 |
| 5,495,356 A | 2/1996 | Sharony et al. | 359/128 |
| 5,504,609 A | 4/1996 | Alexander et al. | 359/125 |
| 5,506,710 A | 4/1996 | Hamel | 359/115 |
| 5,532,864 A | 7/1996 | Alexander et al. | 359/177 |
| 5,550,666 A | 8/1996 | Zirngibl | 359/125 |
| 5,557,439 A | 9/1996 | Alexander et al. | 359/130 |
| 5,559,624 A | 9/1996 | Darcie et al. | 359/125 |
| 5,574,584 A | 11/1996 | Darcie et al. | 359/125 |
| 5,587,830 A | 12/1996 | Chraplyvy et al. | 359/341 |
| 5,600,742 A | 2/1997 | Zirngibl | 385/37 |
| 5,623,356 A | 4/1997 | Kaminow et al. | 359/123 |
| 5,627,925 A | 5/1997 | Alferness et al. | 385/17 |
| 5,631,758 A | 5/1997 | Knox et al. | 359/127 |
| 5,633,741 A | 5/1997 | Giles | 359/124 |
| 5,654,816 A | 8/1997 | Fishman | 359/177 |
| 5,673,129 A | 9/1997 | Mizrahi | 359/124 |
| 5,673,342 A | 9/1997 | Nelson et al. | 385/24 |
| 5,680,490 A | 10/1997 | Cohen et al. | 385/24 |
| 5,694,234 A | 12/1997 | Darcie et al. | 359/125 |
| 5,696,615 A | 12/1997 | Alexander | 359/134 |
| 5,710,649 A | 1/1998 | Mollenauer | 359/123 |
| 5,712,716 A | 1/1998 | Vanoli et al. | 359/125 |
| 5,712,932 A | 1/1998 | Alexander et al. | 385/24 |
| 5,712,936 A | 1/1998 | Hoag et al. | 385/24 |
| 5,715,076 A | 2/1998 | Alexander et al. | 359/130 |
| 5,719,696 A | 2/1998 | Chraplyvy et al. | 359/341 |
| 5,726,784 A | 3/1998 | Alexander et al. | 359/125 |
| 5,734,486 A | 3/1998 | Guillemot et al. | 359/139 |
| 5,742,416 A | 4/1998 | Mizrahi | 359/134 |
| 5,748,349 A | 5/1998 | Mizrahi | 359/130 |
| 5,748,350 A | 5/1998 | Pan et al. | 359/130 |
| 5,754,320 A | 5/1998 | Watanabe et al. | 359/117 |
| 5,761,351 A | 6/1998 | Johnson | 385/15 |
| 5,778,118 A * | 7/1998 | Sridhar | 385/24 |
| 5,784,184 A | 7/1998 | Alexander et al. | 359/125 |
| 5,786,916 A | 7/1998 | Okayama et al. | 359/128 |
| 6,014,237 A * | 1/2000 | Abeles et al. | 359/124 |

* cited by examiner

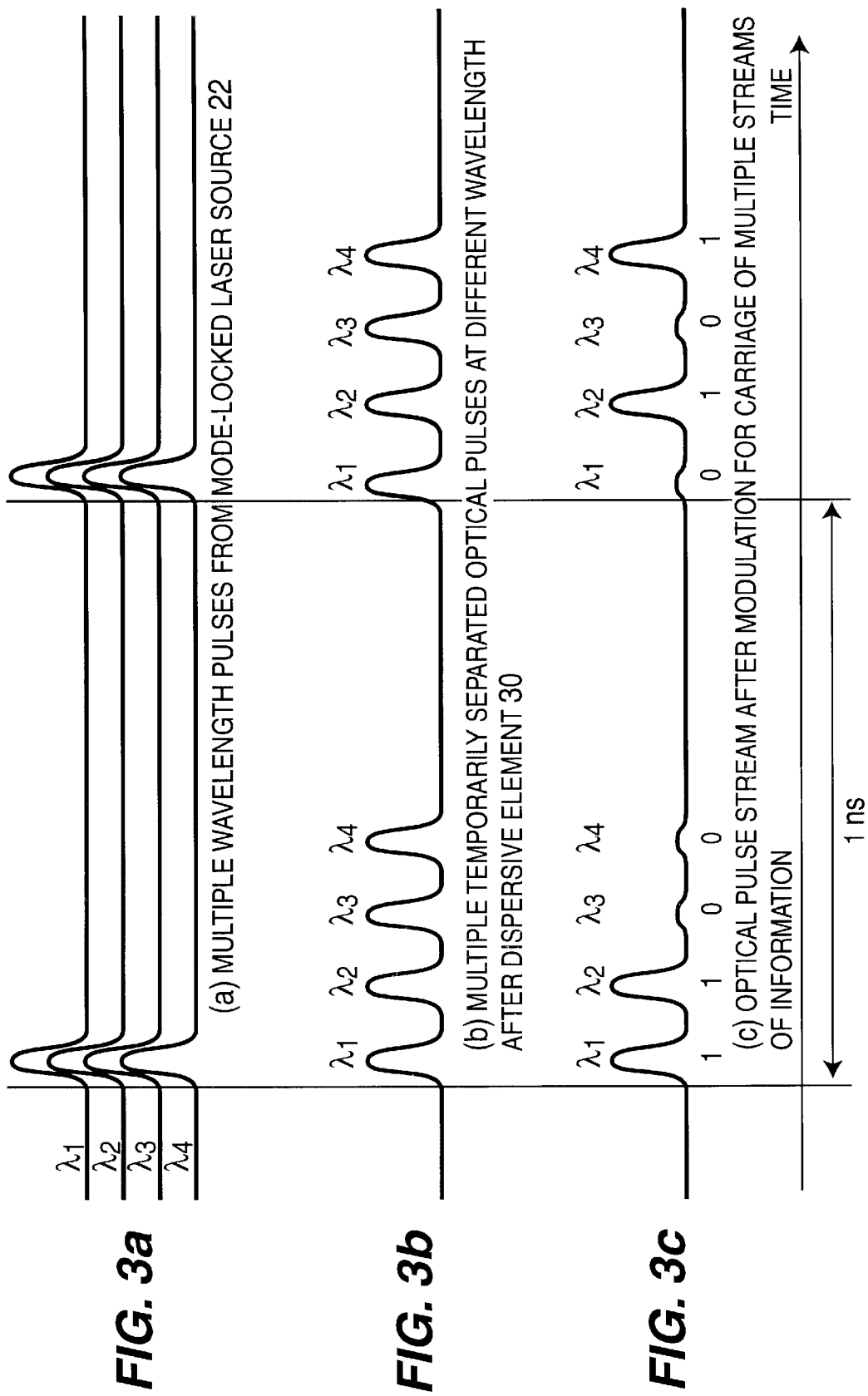

MULTI-WAVELENGTH DENSE WAVELENGTH DIVISION MULTIPLEXED OPTICAL SWITCHING SYSTEMS

CROSS-REFERENCE TO RELATED APPLICATIONS

The present application claims priority from U.S. Provisional Patent Application Ser. No. 60/087,522, filed Jun. 1, 1998, and U.S. Provisional Patent Application Ser. No. 60/093,358, filed Jul. 20, 1998. The present application is also a continuation-in-part of U.S. Patent Application Ser. No. 09/184,906 filed Nov. 3, 1998 now U.S. Pat. No. 6,014,237.

BACKGROUND OF THE INVENTION

1. Field of the Invention

The present invention relates to the architecture of completely optical high capacity crossconnected systems for multi-wavelength mode locked dense wavelength division multiplexed (MWML-DWDM) optical communication systems using multiwavelength mode locked (MWML) lasers as light sources for the transport of, e.g., data and telephony services in fiber optic networks.

2. Description of the Prior Art

There has been much research conducted over the years concerning the use of dense wave length division multiplexing (DWDM) systems to increase the bandwidth of existing and emerging fiber optic transmission systems. As shown in FIG. 1, a conventional approach has been to use a plurality of stabilized laser diodes 10 operating at or near 1550 nm with wavelength separations of 0.4, 0.8, or 1.6 nm (frequency separations of 50, 100, or 200 GHz) where each laser diode 10 is modulated at rates between 155 Mb/s and 2.5 Gb/s by wideband external modulators 12. These modulated optical carriers, or optical data streams, are combined together using an optical combiner 14 to construct a higher bit-rate optical data stream that can be amplified by one or more wideband power amplifiers 16 and can be inserted into one single-mode optical fiber 18.

Conventional DWDM optical transmission systems of the type illustrated in FIG. 1 can transmit data of very high bit rates over conventional fiber optic lines. As is apparent from FIG. 1, such conventional DWDM optical transmission systems require a plurality of light sources 10 and data modulators 12. These components are expensive and complex, and the resulting multicomponent systems are exceedingly complex and expensive. A less expensive alternative is desired.

Recently, multiwavelength mode-locked (MWML) laser light sources have been developed which generate a plurality of pulses of different wavelengths in which each wavelength emits picosecond pulses at high rates. When a conventional pulse interleaving configuration including delay line units is included within such MWML laser sources, the output optical pulse train may be multiplexed to provide very high pulse rates at each wavelength, such as those which are suitable for DWDM transmission. A MWML laser source of this type has been described by Shi et al. at a presentation entitled "Four-Wavelength, 10 GHz Picosecond Pulse Generation From an Active Mode-Locked Single-Stripe Diode Laser" given May 20, 1997, at the 1997 Conference on Lasers and Electro-Optics, and described in an associated paper entitled "20×5 Gbit/s Optical WDM Transmitter Using a Single-Stripe Multiwavelength Modelocked Semiconductor Laser." Commercial embodiments of such a MWML laser source are described in commonly assigned U.S. patent application Ser. No. 09/191,218 filed Nov. 12, 1998, now U.S. Pat. No. 6,192,058 issued Feb. 20, 2001. As described therein, a single mode-locked laser, preferably an actively mode-locked semiconductor external cavity laser (AMSECL), emits a multiplicity of fundamental optical frequency components. An RF drive signal is provided to a semiconductor optical amplifier (SOA) situated within an optical resonator such as a Fabry-Perot cavity or ring resonator by a clock source so that the SOA amplifies mode-locked pulses periodically. The SOA preferably comprises an angled-stripe InGaAsP or GaAs/AlGaAs semiconductor optical traveling wave amplifier with facet reflectivities of substantially $10^{-6}$ or less. Such low reflectivity is necessary to keep the gain spectrum of the SOA free of undulations due to SOA Fabry-Perot modes which otherwise would interfere with the generation of multiple wavelengths, since some wavelengths would be emphasized while others would be muted by such undulations. Each fundamental optical frequency component is associated with its own unique set of additional frequency components such that each fundamental optical frequency and additional frequency components make up a unique wavelength band ("comb") of frequency components. As a result, a multiplicity of combs of optical frequency components is provided by the MWML laser source. In the time domain, the MWML laser source emits pulses of overall duration approximately equal to the inverse of the spectral width of each comb in the frequency domain.

Owing to the close wavelength spacing of the optical frequencies within a given comb, each comb may be considered as a single unique wavelength source for the purposes of DWDM systems.

In the aforementioned commonly assigned U.S. Patent Application, different embodiments of the MWML laser source are described, where each MWML laser source emits multiple discrete groups of wavelengths simultaneously in a short time interval, and each group is located at a wavelength suitable to DWDM optical transmission. Feedback or feedthrough optics modules are combined with gain modules to provide embodiments suitable for DWDM transmission. The optics are coupled to one or more ports of the amplifier in Fabry-Perot or optical ring resonator configurations to provide simultaneous feedback at the plurality of wavelengths and to provide substantially identical round-trip travel times and net gains within the lasing cavity for pulses at each output wavelength.

In accordance with the invention, it is desired to develop elements such as optical crossconnects for a DWDM optical transmission system so as to provide flexible, high capacity means for routing high bandwidth fiber optic data streams. It is particularly desired that the optical crossconnect allows fast, economical circuit switching capability using a MWML laser source of the type described in the aforementioned patent application. It is further desired in accordance with the present invention to develop add/drop multiplexers and other components of a DWDM optical transmission system using such MWML laser light sources so as to provide an improved MWML-DWDM optical transmission system. The present invention has been designed to meet these needs in the art.

SUMMARY OF THE INVENTION

The present invention relates to system architecture and usage of a dense wavelength division multiplex (DWDM) crossconnect system and optical add/drop multiplexer which preferably, though not necessarily, uses a multi-wavelength mode locked (MWML) external cavity laser as a fundamental sub-circuit for optically cross-connecting several multi-wavelength data channels onto similar data channels having an interchanged set of optical wavelengths. The optical crossconnect architecture in accordance with the invention allows the rearrangement of multiple logical channels in a timely manner to support protection switching, traffic grooming, and other telecommunications network functions. The crossconnect architecture of the invention further supports multiple physical fibers into and out of the crossconnect, where each fiber carries multiple logical channels on multiple wavelength pulses. In accordance with the invention, any "logical channel" on a physical fiber that is assigned a particular wavelength carrier can be cross-connected onto any other physical fiber and assigned another wavelength carrier.

The present invention is generally directed to a network element for use in a dense wavelength division multiplexed (DWDM) optical network. In an add/drop configuration, the network element receives input optical signals from the DWDM optical network at a first plurality of input ports and input signals at a second plurality of input (ADD) ports for insertion into the optical network, and emits output optical signals to the DWDM optical network at a first plurality of output ports and output signals at a second plurality of output (DROP) ports.

In a preferred embodiment, the network element comprises at least one optical receiver that receives the input optical signals from the optical network at the first plurality of input ports and demodulates digital data from at least one designated wavelength of the input optical signals. The network element further comprises a multiwavelength optical source which emits wavelength ordered repetitive periodic (WORP) pulse sequences within a plurality of discrete wavelength bands at its output port, and at least one modulator which receives the WORP pulse sequences from the multiwavelength optical source and modulates the digital data from the at least one designated wavelength onto selected wavelengths of a WORP sequence to create the output optical signals for application to the DWDM optical network. Data streams to be added (via ADD ports) are multiplexed with the "express" (or through) data streams to comprise the signals to be modulated onto the output port optical carriers. Preferably, each output port contains a multiplicity of optical data channels each of which is assigned a unique wavelength from the WORP pulse sequences.

In the preferred embodiment, the multiwavelength optical source is a multiwavelength mode-locked (MWML) laser including a semiconductor optical amplifier which is actively driven by a radio frequency signal to emit periodic pulses at a plurality of wavelengths simultaneously at aport of the amplifier. The radio frequency signal is either a fundamental frequency or a harmonic of the radio frequency signal that substantially equals the inverse of a round trip travel time of pulses circulating within a cavity of the MWML laser. A temporal dispersion element time shifts the plurality of wavelengths by differential wavelength-dependent delays so as to transform pulses output by the MWML laser into a wavelength-sequential sequence for application to the modulator.

The network element of the invention may also be configured as a crossconnect with an optical fiber switch core for use in a dense wavelength division multiplexed (DWDM) optical network. Typically, the optical crossconnect receives a first plurality of electrical or optical data signals at input ports on an input side and provides a second plurality of electrical or optical data signals at output ports on an output side. In a preferred embodiment, the optical crossconnect comprises a switching control element which outputs a selection signal, a multiwavelength optical source which emits WORP pulse sequences within a plurality of discrete wavelength bands simultaneously, and at least one modulator which receives the WORP pulse sequences from the multi-wavelength optical source and modulates the first plurality of data signals from the input ports onto selected wavelengths of a WORP pulse sequence from the multi-wavelength optical source so as to create a modulated WORP pulse sequence for transmission over the optical fiber switch core. The modulated WORP pulse sequence contains a multiplicity of optical data channels each of which is assigned a unique wavelength from the WORP pulse sequence. The modulated WORP pulse sequence is then received by least one optical receiver which demodulates digital data from wavelengths in the modulated WORP pulse sequence as selected by the selection signal and provides the digital data as the second plurality of data signals to the output ports.

Corresponding DWDM transmission methods are also described as will be apparent to one skilled in the art from the following description.

BRIEF DESCRIPTION OF THE DRAWINGS

The present invention will be better understood after reading the following detailed description of the presently preferred embodiments thereof with reference to the appended drawings, in which:

FIGS. 3(a)–3(c) illustrate four of the pulses of varying wavelength contained within the optical signal emitted by the WORP-DWDM optical source of FIG. 2 before (FIG. 3(a)) and after (FIG. 3(b)) the pulsed light has passed through the temporal dispersion filter or grating and been transformed into a WORP sequence of optical pulses suited for modulation with multiple streams of data (as shown in FIG. 3(c)).

DETAILED DESCRIPTION OF THE PREFERRED EMBODIMENTS

Figure 1:
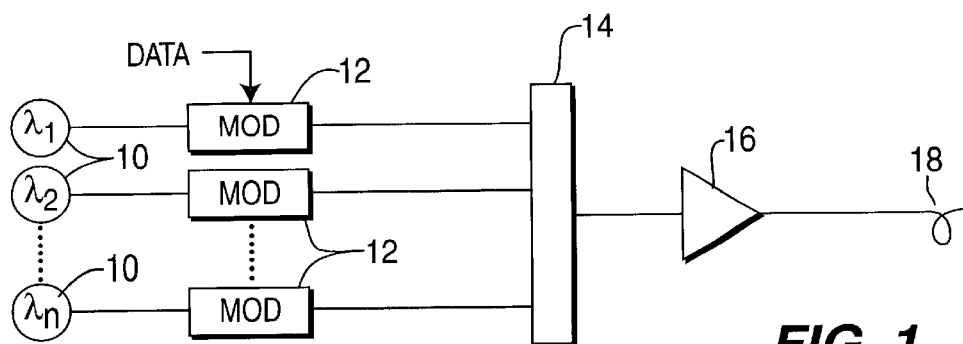
FIG. 1 is a schematic diagram of a conventional DWDM optical transmitter, which requires a plurality of light sources, and modulators, one for each optical carrier.

A system and method which meets the above-mentioned objects and provides other beneficial features in accordance with the presently preferred exemplary embodiment of the invention will be described below with reference to FIGS. 2–23. Those skilled in the art will readily appreciate that the description given herein with respect to those figures is for explanatory purposes only and is not intended in any way to limit the scope of the invention. Throughout the description, like reference numerals will refer to like elements in the respective figures.

The present invention provides opticalcrossconnects and add-drop multiplexers for multiwavelength mode-locked dense wavelength-division-multiplexed (MWML-DWDM) optical transmission systems, preferably, though not necessarily, including a dense wavelength-division-multiplexed (DWDM) optical transmitter having a multiwavelength mode-locked (MWML) laser source which generates discrete pulses at different frequencies of light for modulation with data carried by an electronic carrier via a high speed electronic time domain multiplexer (ETDM). In a presently preferred telecommunications embodiment, the MWML-DWDM optical transmitter may be connected to multiple telecommunications transmission interfaces, such as Synchronous Optical Network (SONET) Optical Carrier (OC) interfaces over the entire SONET hierarchy including 155.52 Mbps (SONET OC-3), 622.080 Mbps (SONET OC-12), 2.488 Gbps (SONET OC-48), 10 Gbps (SONET OC-192) or T-carrier interfaces DS-1 (1.544 Mbps) and DS-3 (44.736 Mbps), or data networking interfaces including IEEE 802.3 (Ethernet), 10-Base T Ethernet, 100-Base T Ethernet, Gigabit Ethernet, FDDI, Fibre Channel, ESCON, IEEE 802.5 (Token Ring), and others. Generally, multiple signals from these interfaces are electronically multiplexed together by an ETDM to form a single high bit-rate digital transmission stream that is used to modulate a wavelength ordered repetitive periodic (WORP) optical multiwavelength pulse stream coming from the WORP-DWDM source comprising a MWML laser source and temporal dispersion element. As will be explained in more detail below, at least one optical modulator device is used to encode the multiplexed signal onto at least one WORP pulse stream such that it appears at the output of the MWML-DWDM optical transmitter to provide multiple channels of information carried on a wavelength-coded set of modulated pulses over an optical fiber to a receiver where the wavelength-coded data is received and decoded.

As will be explained in more detail below, several multiwavelength data channels are crossconnected onto similar data channels having an interchanged set of optical wavelengths. The opticalcrossconnect architecture allows the rearrangement of multiple logical channels in a timely manner to support protection switching, traffic grooming, and other telecommunications network functions. The crossconnect architecture further supports multiple physical fibers into and out of the crossconnect, where each fiber carries multiple logical channels on multiple wavelengths of light. In accordance with the invention, any "logical channel" on a physical fiber that is assigned a particular wavelength carrier can be cross-connected onto any other physical fiber and assigned another wavelength carrier.

Wavelength-Ordered Repetitive Periodic DWDM Optical Source

Figure 2:
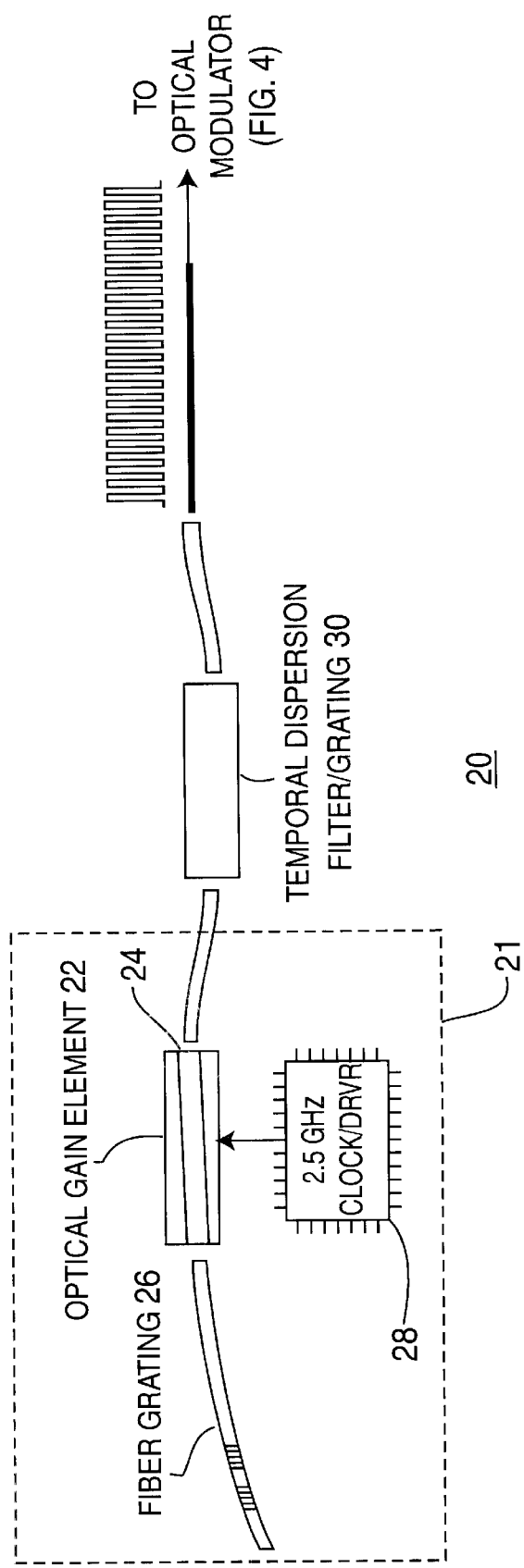
FIG. 2 is a schematic diagram of an embodiment of a WORP-DWDM optical source comprising a single MWML laser source and a temporal dispersion filter or grating for use in MWML-DWDM transmission systems.

FIG. 2 illustrates an embodiment of a WORP-DWDM optical source 20 for use in a simple integrated high performance MWML-DWDM optical transmission system in place of the complex prior art multicomponent DWDM optical transmission system schematically shown in FIG. 1. As shown, the WORP-DWDM optical source 20 includes a MWML laser source 21 of the type described in the above-mentioned commonly assigned patent application. In the embodiment of FIG. 2, the MWML laser source 21 preferably comprises an angled-stripe In GaAsP or GaAs/AlGaAs SOA or other optical gain element 22 for use as a gain element in a mode locked external cavity laser system. In the embodiment of FIG. 2, one mirror of the MWML laser source 21 is a facet 24 of the optical gain element 22 while the other mirror is a fiber grating 26 that preferentially reflects discrete wavelengths so as to provide simultaneous feedback at the plurality of wavelengths and to provide substantially identical round-trip travel times and net gains within the lasing cavity for pulses at each output wavelength. Both a DC signal and a RF signal from a CW RF source 28 bias the optical gain element 22 so that the optical gain element 22 amplifies periodic pulses at a plurality of wavelengths simultaneously. Generally, this is accomplished by selecting an RF signal which has a frequency or a sub-harmonic that substantially equals the inverse of the round trip travel time of pulses circulating within the cavity of the MWML laser source 21. As shown in FIG. 2, the optical signal emitted by MWML laser source 21 is passed through a temporal dispersive device, such as a dispersion filter or dispersive fiber grating 30, and the optical signal is thereby transformed into a WORP sequence of pulses that occurs in a periodic sequence, where each pulse within the WORP-frame has a different wavelength. Individual pulses emitted by the MWML laser source 21 may be intentionally or unintentionally chirped, as the term is known to those skilled in the art, within the MWML laser source 21, such that their duration may be reduced or increased by application of dispersion by the temporal dispersion filter or grating 30 depending on the sign of said dispersion. In accordance with the invention, the sign of temporal dispersion employed to generate the WORP sequence of pulses from the MWML laser source is selected so as to reduce the duration of the pulses. The result is a WORP pulse stream having wavelengths corresponding to DWDM channels of bit rates of, e.g., 2.5 Gbits/sec each.

Unlike a conventional mode-locked laser, the MWML laser source 21 simultaneously emits many pulses of discrete wavelengths that are subsequently converted into such a WORP pulse stream In contradistinction to conventional mode locked lasers, such as those employed by the system of Gregory W. Faris described by U.S. Pat. No. 5,347,525 entitled "Generation of Multiple Stabilized Frequency References Using a Mode-Coupled Laser" and another described by Wayne H. Knox and Martin C. Nuss in U.S. Pat. No. 5,631,758 entitled "Chirped-Pulse Multiple Wavelength Telecommunications System," the MWML laser source 21 of the invention emits periodic pulses within a plurality of discrete wavelength bands whose aggregate spectral bandwidth is equal to or greater than that of a single wavelength component, times the number of wavelengths emitted. Accordingly, and by way of example, a single 1550-nm-wavelength MWML laser source would be capable of providing optical carriers sufficient to support DWDM channels over 32 nm of optical bandwidth, without being required to emit pulses of duration less than 10 psec(FWHM), whereas such pulses would only support channels over merely 0.32 nm in the case of the conventional mode-locked laser system architectures cited above.

MWML laser source 21 simultaneously emits a multiplicity of pulses each of discretely different wavelength during each MWML laser source period, i.e., during each WORP-frame, so as to form the basis for an advanced MWML-DWDM optical transmission system in accordance with the invention. By addition of dispersive element 30, the MWML laser source 21 is transformed into a WORP-DWDM optical source 20 that emits sequential pulses of discrete wavelength, where the temporal pattern of pulses resembles a rainbow, albeit at infrared wavelengths. For example, a 16-wavelength WORP-DWDM optical source 20 might emit 10-psec full-width half maximum pulses in the repeating periodic temporal sequence of $\lambda_1, \lambda_2, \lambda_3, \lambda_4, \lambda_5, \lambda_6, \lambda_7, \lambda_8, \lambda_9, \lambda_{10}, \lambda_{11}, \lambda_{12}, \lambda_{13}, \lambda_{14}, \lambda_{15}, \lambda_{16}, \lambda_1, \lambda_2, \lambda_3, \lambda_4, \lambda_5, \ldots$ such that $\lambda_1 > \lambda_2 > \lambda_3 > \lambda_4 > \lambda_5 > \lambda_6 > \lambda_7 > \lambda_8 > \lambda_9 > \lambda_{10} > \lambda_{11} > \lambda_{12} > \lambda_{13} > \lambda_{14} > \lambda_{15} > \lambda_{16}$ are the wavelengths of pulses emitted by the MWML laser source 21. In this sequence, the time allocated uniquely for emission of a single pulse of one wavelength is termed a "pulse-frame," which also corresponds to the interval between subsequent pulses of differing wavelength. The time allocated for emission of the sequence of pulses $\lambda_1, \lambda_2, \lambda_3, \lambda_4, \lambda_5, \lambda_6, \lambda_7, \lambda_8, \lambda_9, \lambda_{10}, \lambda_{11}, \lambda_{12}, \lambda_{13}, \lambda_{14}, \lambda_{15}, \lambda_{16}$, is termed a "WORP-frame." The dispersion element 30, by introducing a differential wavelength-dependent delay, transforms the output of the MWML laser source 21, four wavelengths of which are shown in FIG. 3(a), into a WORP sequence, as partially shown in FIG. 3(b) for the four wavelengths of the MWML laser source 21 of FIG. 3(a). As illustrated, each wavelength component is delayed by dispersion element 30 by a duration such that, at the input to an optical modulator, the pulses cycle once during each WORP-frame and do not temporally overlap to a great extent. FIG. 3(c) illustrates the partial WORP sequence of FIG. 3(b) after it has been modulated with streams of data [1100] and [0101] during respective pulse-frames by such an optical modulator.

It is a characteristic of the WORP-DWDM source of the invention that the length of its WORP-frame and the number of wavelengths determine the duration of its characteristic pulse-frame. The duration of a pulse-frame determines the optical frequency band occupied by pulses. For transform-limited pulses the product of the gaussian full-width half-maximum pulse duration and the gaussian full-width half-maximum optical frequency spectrum is substantially equal to 0.4413. For a non-transform-limited pulse this product is larger. The generation of a greater multiplicity of wavelengths within the WORP-DWDM source for a given WORP-frame duration is associated with the use of a greater portion of optical frequency spectrum for each individual wavelength. Accordingly, the spacing between adjacent wavelengths is greater for WORP-DWDM sources that employ a greater number of wavelengths for a given WORP-frame. In general, it may be desirable to employ narrow wavelength spacings. Accordingly, it is a feature of the present invention that the multiple WORP-DWDM sources can be employed to alleviate this limitation, as taught below for interleaving of wavelengths deriving from multiple WORP-DWDM sources within the context of the DWDM optical transmitter architectures of the invention.

Multi-Wavelength Mode-Locked DWDM Optical Transmitter Embodiments

Figure 4:
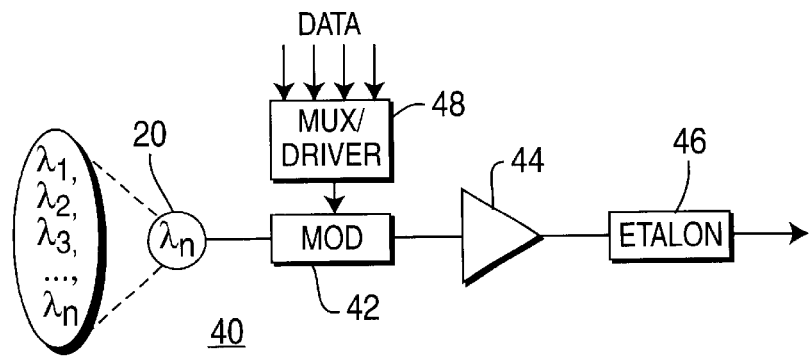
FIG. 4 is a schematic diagram of an embodiment of an MWML-DWDM optical transmitter which requires only a single WORP-DWDM optical source and modulator.

The WORP-DWDM optical source 20 of FIG. 2 using MWML laser sources of the type described in U.S. patent application Ser. No. 09/191,218 filed Nov. 12, 1998, now U.S. Pat. No. 6,192,058 issued Feb. 20, 2001 may be used to form a MWML-DWDM optical transmitter 40 by adding a high-speed optical modulator 42 which impresses digital data upon each individual wavelength in the output pulse sequence and by adding an optical amplifier 44 as shown in FIG. 4. An etalon 46, or equivalent, filter known to those skilled in the art may also be used to accomplish one or both of narrowing the spectrum of each individual wavelength emitted from the optical modulator 42 to mitigate dispersion for long distance transmission or in any application for which dispersion is a critical issue and of converting a shorter pulse data return-to-zero (RZ) modulation format to one of a longer pulse RZ modulation format and a non-return-to-zero (NRZ) modulation format.

In addition to the components shown in FIGS. 2 and 4, electronic components are required to drive the MWML-DWDM optical transmitter 40 of the invention. For example, a high-speed digital electronic time domain multiplexer (ETDM) 48 is employed to combine a number of lower-speed signals, one for each wavelength, into the combined data signal for driving the optical modulator 42. For example, if 16 signals, each of 2.5 Gbit/sec rate, are combined, they will create a 40 Gbit/sec signal for input into the optical modulator 42. High-speed modulation electronics capable of 40 Gbit/sec rates have been demonstrated by Rockwell and others, and other suitable high-speed modulators 42 are known to those skilled in the art. Yet higher speed modulators and electronic multiplexers are anticipated to become available in the near future.

A significant advantage may be obtained by a combination of multiple lower-rate data streams on multiple wavelength optical carriers by means of the MWML-DWDM optical transmitter 40 of the invention, in that the number of optical components required to transmit these multiple data streams is significantly reduced. For example, in the prior art, a separate printed circuit board module is required for each individual wavelength stream to be transmitted in a DWDM optical transmission system, whereas in the present invention a single printed circuit board module would be capable of transmitting,e.g., 16 or 32 different DWDM signals. Moreover, only a single modulator is required to code many data streams, while the resulting DWDM optical signal remains compatible with standard optical receiver terminal equipment. As will be explained below, a plurality of MWML-DWDM optical transmitters may further be arranged in parallel to form a high performance transmitter by optically combining the outputs of each transmitter.

As an additional advantage, a single optical gain element such as SOA 22 provides optical gain for all wavelength signals, mitigating reliability issues associated with multiple laser sources employed in prior art DWDM systems. Also, wavelength is determined only by passive components, mitigating reliability issues associated with active circuit components. In addition, only a single active source needs to be stocked to correct any failures, as opposed to different sources for each different WDM wavelength in systems as currently deployed.

Modulator speed is limited by the ability to bias at maximum bit rates both the full "on" and full "off" states. However, those skilled in the art will appreciate that modulators and associated driving and equalizing electronics are generally limited by the product of modulation amplitude and speed of modulation, and thus can be used at bit rates higher than their nominal bit rate for full on-off operation in a modulator 42 biased at extinction by modulating only to a partial-on condition. The optical power thus sacrificed can be made up by the optical amplifier 44 following the modulator 42. Therefore, the aggregate bit rate of the MWML-DWDM optical transmitter 40 of the invention is understood to be limited ultimately by the maximum speed of the digital ETDM 48 and its associated electronic components.

Additional electronic components required may include amplifiers and equalizers necessary to drive the high-speed modulator 42, components to effect clock generation, stabilization, and distribution between the digital ETDM 48, and the WORP-DWDM optical source 20, and components to provide RF drive to the SOA 22 within the MWML laser source 21. In addition to these electronic components, optical amplification may be included prior to the optical modulation according to system requirements and trade-offs. In addition to these electronic and optoelectronic components, a complete MWML-DWDM optical transmitter 40 in accordance with the invention will require control electronics and software control functionality enabling it to function as part of a digital optical transmission network. Such apparatus and methods are well known to those skilled in the art and will not be discussed in further detail here.

Figure 5:
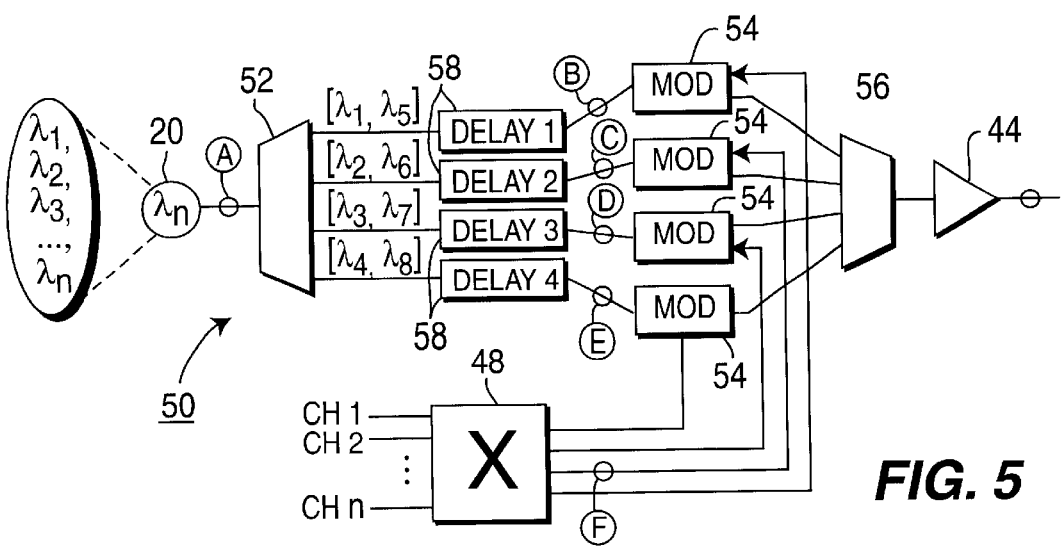
FIG. 5 is a schematic diagram of an embodiment of a MWML-DWDM optical transmitter employing a four-way splitting, modulation, and recombination process for multiplying the data rate output of a MWML-DWDM optical transmitter of the type illustrated in FIG. 4.

In a presently preferred embodiment of the MWML-DWDM optical transmitter of the invention, it is desirable to generate higher modulation rates than may be conveniently or economically generated by available components in the embodiment of FIG. 4, with or without the bit rate enhancement technique described above involving partial "on" biasing of the optical modulator. In such circumstances, it is possible to employ a multiplicity of modulators associated with respective portions of the pulse stream emitted by the WORP-DWDM optical source 20 of the invention so as to exceed the limitations of the modulation rate of a particular modulator. For example, the number of modulators multiplies the data rate when multiple modulators are used. FIG. 5 illustrates a presently preferred embodiment of an MWML-DWDM pulsed optical transmitter 50 in which a WORP pulse sequence, A, emitted by the WORP-DWDM pulsed optical source 20, is divided by splitter 52 into multiple pulse streams.

By way of example, FIG. 5 shows the WORP optical pulse sequence, A, consisting of 8 different wavelengths, $\lambda_1$, $\lambda_2$, $\lambda_3$, $\lambda_4$, $\lambda_5$, $\lambda_6$, $\lambda_7$, $\lambda_8$, where the WORP optical pulse sequence, A, is split into four WORP optical pulse subsequences such that the first WORP optical pulse sub-sequence carries pulses with wavelengths $\lambda_1$, $\lambda_5$, the second WORP optical pulse sub-sequence carries pulses with wavelengths $\lambda_2$, $\lambda_6$, the third WORP optical pulse sub-sequence carries pulses with wavelengths $\lambda_3$, $\lambda_7$, and the fourth WORP optical pulse subsequence carries pulses with wavelengths $\lambda_4$, $\lambda_8$. Each WORP optical pulse subsequence may be independently modulated by electronic data from a switch or digital ETDM 48 using an optical modulator 54, and the resulting modulated WORP optical data sub-streams recombined by optical combiner 56 to form a higher speed WORP optical data stream employing all original 8 different wavelengths. As illustrated, the digital ETDM 48 may provide a separate electronic data stream to each optical modulator 54. By imposing the correct delay element 58 on WORP optical pulses before or after the modulators 54, the timing following recombination can be adjusted to obtain a WORP optical data stream identical to that emitted by a single MWML-DWDM optical transmitter 40 employing a single modulator 42 except that lower speed electronics and slower modulation speeds are necessary. The relative delays of the four WORP optical pulse substreams for a given aggregate data rate are determined by the differing lengths of the fibers over which they are guided, or by similar methods known to those skilled in the art. Those skilled in the art will also appreciate that the delays may all have identical duration or some other adjustable duration to ensure pulses are recombined in the correct timing sequence as in the original WORP optical stream.

Figure 7A:
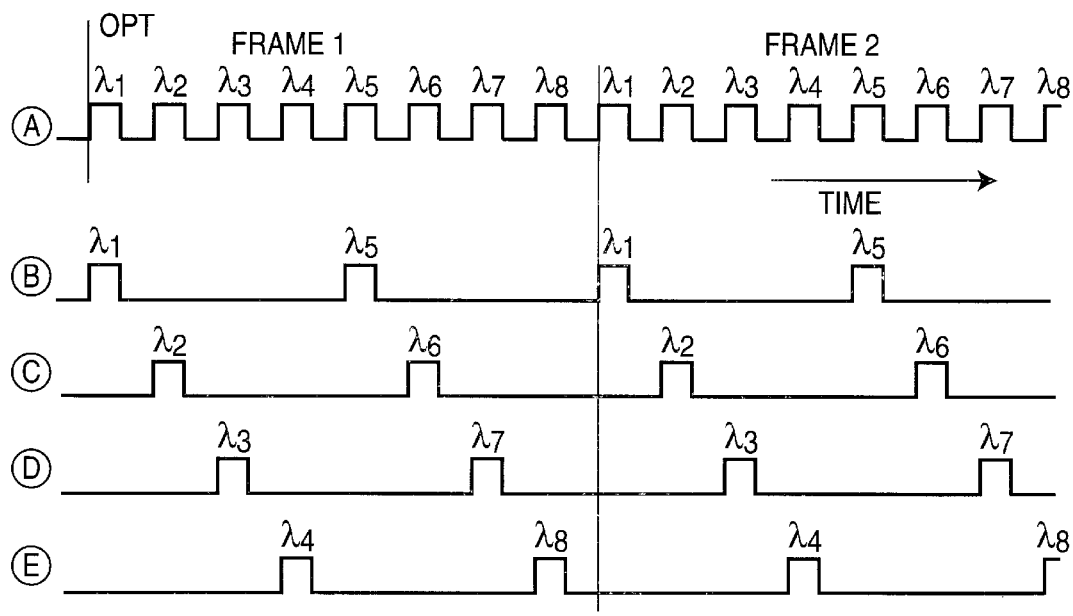
FIG. 7(a) illustrates optical signals from the embodiment of FIG. 5 before modulation is stamped on the different wavelengths.
Figure 7B:
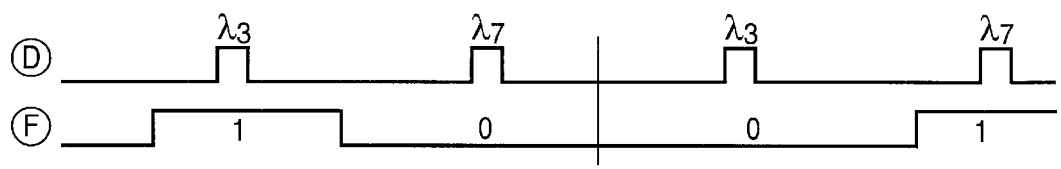
FIG. 7(b) illustrates the encoding of 3 of FIG. 7(a) with the two-bit sequence [10] and the encoding of $\lambda_7$ with the two-bit sequence [01].

FIG. 7(a) illustrates optical signals from the MWML-DWDM pulsed optical transmitter 50 of FIG. 5 at the indicated points A-E before modulation is stamped on the different wavelengths. FIG. 7(b) illustrates the encoding of $\lambda_3$ of FIG. 7(a) with the two-bit sequence [10] and the encoding of $\lambda_7$ with the two-bit sequence [01]. As illustrated, the data signal may have a relatively longer switching cycle than the light pulse.

Figure 8:
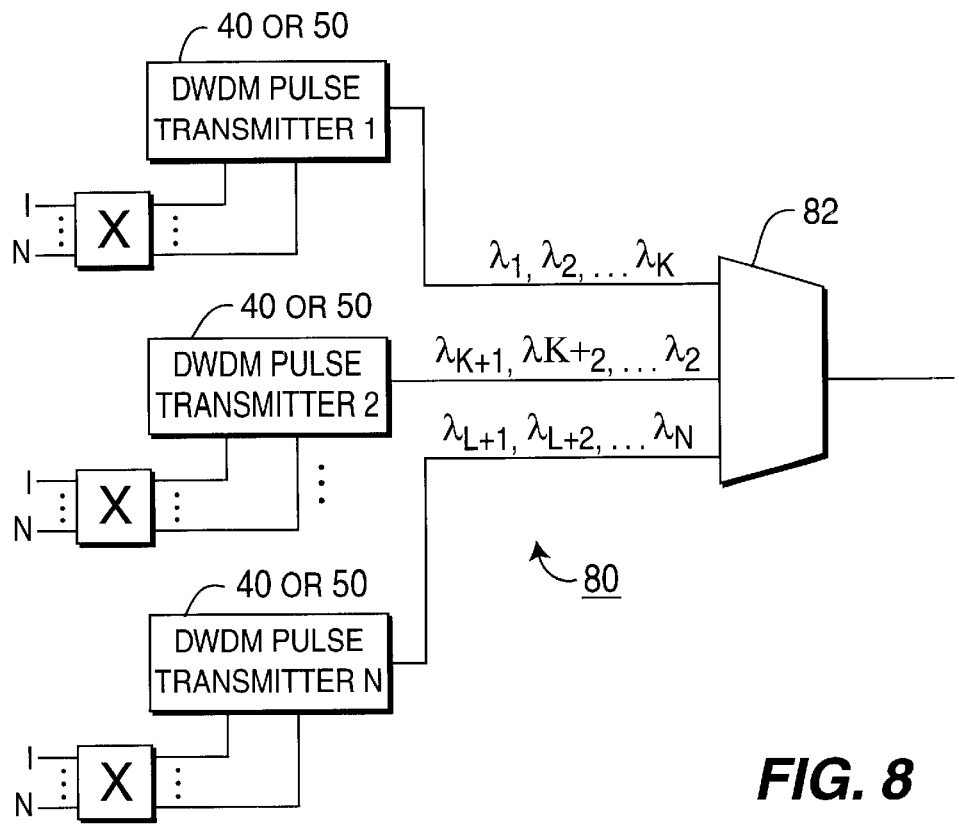
FIG. 8 is a schematic diagram of an embodiment in which a plurality of DWDM optical sources of the type illustrated in FIGS. 4 and 5 are connected in parallel and their outputs combined by an optical combiner so as to output a discrete non-overlapping set of wavelengths each of which represents a separate channel thereby increasing the bandwidth.

FIG. 8 illustrates an embodiment of a MWML-DWDM optical transmitter 80 in accordance with the invention in which a plurality of MWML-DWDM optical transmitters 40 or 50 are disposed in parallel and their outputs combined by an optical combiner 82 to provide further increased throughput. In this embodiment, the outputs of the respective MWML-DWDM optical transmitters 40 or 50 are placed in respective order whereby the output of MWML-DWDM transmitter 1 is in the wavelength order $\lambda_1, \lambda_2, \ldots \lambda_K$, the $\lambda_L$, and the output of MWML-DWDM transmitter 2 is in the wavelength order $\lambda_{K+1}, \lambda_{K+2}, \ldots \lambda_L$, and the output of MWML-DWDM transmitter N is in the wavelength order $\lambda_{K+1} < \lambda_{K+2} < \ldots \lambda_L < \lambda_L < \lambda_{L+2} < \ldots \lambda_N$. In this case the wavelengths are such that $\lambda_1 < \lambda_2 < \ldots < \lambda_K < \lambda_{K+1} < \lambda_{K+2} < \ldots < \lambda_L < \lambda_{L+1} < \lambda_{L+2} < \ldots \lambda_N <$. This illustrative example is one of many; the primary requirement is that the wavelengths associated with MWML-DWDM transmitter 1 are not the same as those associated with MWML-DWDM transmitter 2 through MWML-DWDM transmitter N. Similarly the wavelengths associated with MWML-DWDM transmitter 2 are not the same as those associated with MWML-DWDM transmitter 1 and MWML-DWDM transmitter 3 through MWML-DWDM transmitter N.

Figure 6A:
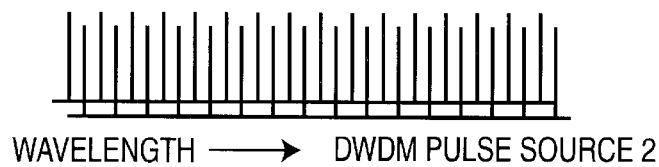
FIGS. 6(a) and 6(b) illustrate the combination of the outputs of two modulators in the embodiment of FIG. 5 by interleaving wavelengths (FIG. 6(a)) and by segregating wavelength bands (FIG. 6(b)).
Figure 6B:
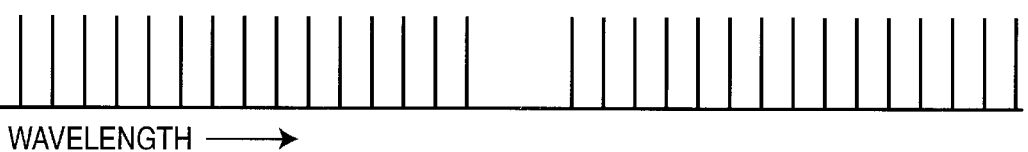

As shown in FIG. 6(a), optical combiner 82 may interleave the wavelengths from the respective modulators. Alternatively, optical combiner 82 may segregate the wavelength bands as shown in FIG. 6(b). An advantage of segregation of wavelength bands is that it provides for a reduced degree of temporal dispersion required by the system. In general, the degree of temporal dispersion may be limited by the broadening of individual pulses, which is limited by channel crosstalk considerations.

Those skilled in the art will appreciate that a large number of wavelengths can be generated with the MWML-DWDM optical transmitter 50 and 80 such that the number of wavelengths is ultimately limited only by the availability of optical spectrum The transmitter embodiments of FIGS. 5 and 8 also have the benefit that they require relatively low speed electronics/optical train (e.g., 2.5 Gbps or 10 Gbps electronics instead of 40 Gbps) and less cost since each optical modulator 54 is used to encode more than one wavelength.

Multi-Wavelength Mode-Locked DWDM-Time-Division-Multiplexed Optical Transmitter Embodiment In accordance with the invention, it is desirable to use time division multiplexing (TDM) to add more data channels without adding more wavelengths. In accordance with the invention, the outputs of several MWML-DWDM optical transmitters of the type described above or several known DWDM optical transmitters may be combined using time division multiplexing (TDM) techniques without the addition of TDM components at the transmitter.

Figure 9:
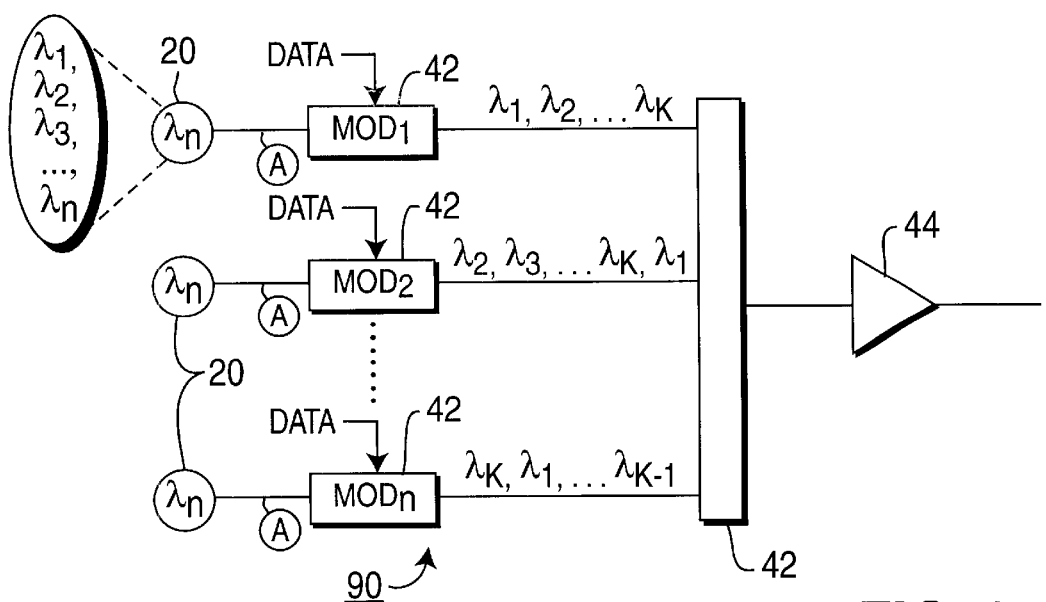
FIG. 9 is a schematic diagram of an embodiment of a MWML-DWDM optical transmitter which uses time division multiplexing (TDM) techniques with a plurality of MWML-DWDM optical transmitters of the type illustrated in FIGS. 4 and 5 to provide a MWML-DWDM-TDM optical transmitter.

For example, as shown in FIG. 9, a MWML-DWDM-TDM optical transmitter 90 may be formed by providing a plurality of MWML-DWDM optical transmitters 40 or 50 of the type described in FIGS. 4 and 5 including WORP-DWDM pulsed optical sources 20 and modulators 42 connected in parallel, optical combiner 92, and an optical amplifier 44. In this embodiment, however, the WORP data streams emitted by the respective modulators 42 are time shifted with respect to each other so that the same wavelengths are not used more than once during the same pulse-frame in different channels of optical data output by the respective MWML-DWDM optical transmitters 40 or 50. In other words, a given wavelength may be used many times during a single WORP-frame to modulate data in different channels so long as it is not used more than once in a given pulse-frame. Since the number of pulse-frames occurring during each WORP-frame is equal to the number, N, of wavelengths, the number of optical carriers transmitted once during each WORP-frame may be increased from N, in the case of a MWML-DWDM transmission system of the invention, to $N^2$, in the case of a MWML-DWDM-TDM transmission system of the invention, for the same WORP-frame.

In accordance with the invention, the several MWML-DWDM optical transmitters thus combined to create an MWML-DWDM-TDM transmitter may rely on a single WORP-DWDM source shared in common among them all.

The increase in data rate for the MWML-DWDM-TDM system architecture is accomplished by more fully using the available optical frequency spectrum, i.e., by transmitting the wide bandwidth associated with short, e.g., 5–10 psec FWHM, pulses and not reducing their bandwidth by the use of an optical filter such as an etalon as taught above for use with a MWML-DWDM transmission system. Such an embodiment relies on a combination of wavelength division multiplexing and ultrafast time division multiplexing in a manner which is better illustrated in FIG. 10.

Figure 10:
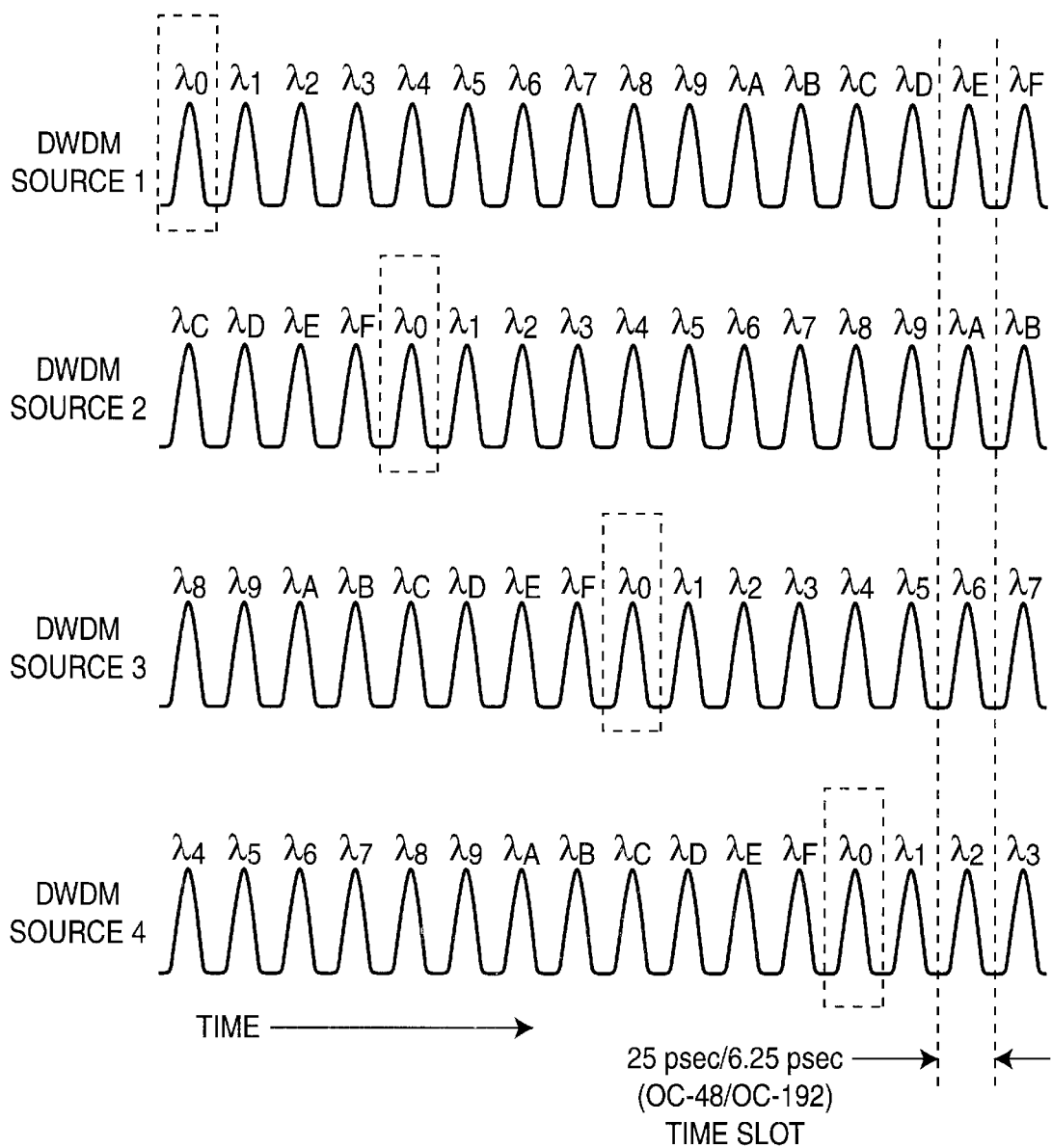
FIG. 10 illustrates the temporal displacement effect of multiple WORP sequences of optical pulses within the MWML-DWDM-TDM optical transmitter of FIG. 9.

FIG. 10 illustrates a 16-wavelength example, taken at point A, of FIG. 9 for four WORP optical pulse sequences. For purposes of illustration, each pulse is labeled according to its wavelength for discussion purposes, is unrelated to any other pulse, and each pulse represents a separate data channel, subject to electro-optic modulation with data If there are 16 wavelengths and 16 pulse-frames, 256 different data streams can be carried by the system represented by FIG. 9 without temporal overlap of wavelengths in different channels. FIG. 10 shows that, when multiple pulse streams are combined in an optical combiner 92, the pulses of a given wavelength in one stream do not temporally overlap with pulses of that wavelength in any other stream For example, the same 16 wavelengths ("0"–"F") would repeat in each channel and occur in each pulse-frame but in different WORP optical pulse sequences at different times. As shown in FIG. 10, the pulses of wavelength $\lambda_0$ occur in the first pulse-frame for the WORP optical pulse sequence from WORP-DWDM source 1, in the fifth pulse-frame for the WORP optical pulse sequence from WORP-DWDM source 2, and so forth. While only four WORP optical pulse sequences are shown, the maximum number of four WORP optical pulse sequences is equal to the number of different wavelengths, N. Thus, in the example where 16 wavelengths marked $\lambda_0$ through $\lambda_F$ in hexadecimal format are shown, 16 different four WORP optical pulse sequences may be employed. As illustrated with respect to the fifteenth pulse-frame of FIG. 10, as marked by the two vertical dotted lines, no two wavelengths appear twice in pulse-frame. The same is true for any pulse-frame. By arranging the wavelengths temporally as well as by frequency, TDM switching techniques may be used to select a pulse-frame and then to select any given wavelength within that pulse-frame using DWDM filtering techniques, thereby expanding the throughput of the system TDM switching techniques have been developed which may be incorporated into MWML-DWDM-TDM receiver circuitry to separate the wavelength channels. Electro-optic modulators have been demonstrated with 100 GHz 3 dB bandwidths, and commercial units with 40 GHz bandwidths, capable of switching 12.5 psec pulses electronically at their rated bandwidths are sold by Sumitomo Cement, Inc. As noted above, the maximum operating speed of such modulators may be traded-off against attenuation, so that significantly faster electro-optic modulation rates may be obtained at the expense of optical power loss if sufficiently high-speed electronic drivers are available. Preferably, these conventional optical switches can be used for TDM purposes.

All-optical switching systems are an alternative for MWML-DWDM-TDM systems, and they are capable of switching at 5 psec or shorter time intervals. The terahertz optical asymmetric demultiplexer (TOAD) described in U.S. Pat. No. 5,493,433, is an example of the nonlinear optical loop mirror (NOLM) class of all-optical switches As another example, K. Hall et al. of MIT Lincoln Laboratory has demonstrated similar all-optical switching techniques which are based on polarization switching phenomena but are otherwise analogous to the TOAD, as described in her paper CMA2, "Interferometric All-Optical Switching Using Non-linearities in Semiconductor Optical Amplifiers Biased at Transparency" at the 1998 Conference on Lasers and Electro-Optics and published in the proceedings thereof by the Optical Society of America. While neither of these two groups demonstrated multi-wavelength switching of the type necessary to simultaneously switch many pulse streams, the present inventors have determined that it is possible to simultaneously switch pulses of multiple wavelengths through such nonlinear all-optical switches and such TDM switching devices may be used in a MWML-DWDM-TDM receiver in accordance with the invention.

Also, the TDM-type embodiment of FIG. 9 may also be used in a modified version of the embodiment of FIG. 5.

MWML-DWDM Optical Transmission Systems Using MWML-DWDM Optical Transmitters

Figure 11:
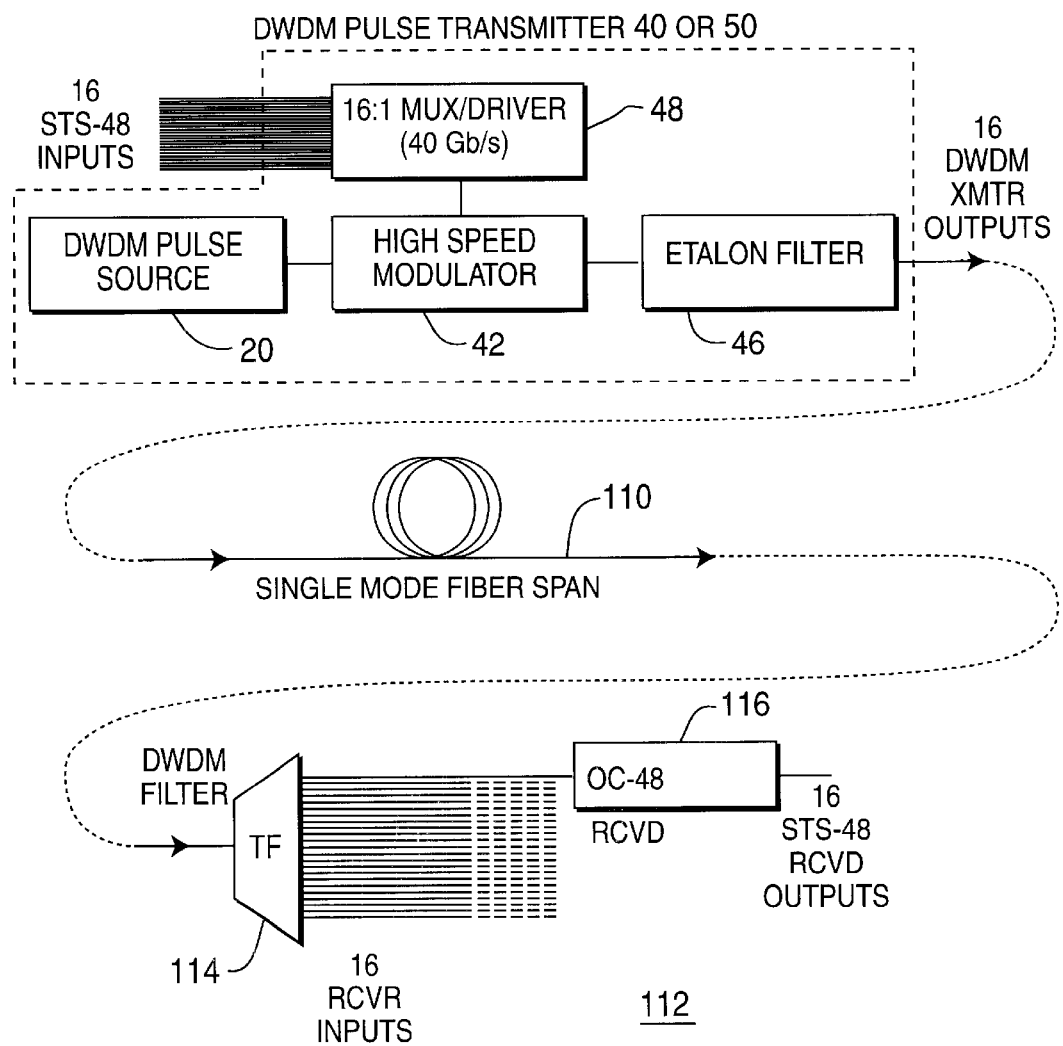
FIG. 11 is a schematic diagram of an embodiment of a MWML-DWDM optical transmission system using MWML-DWDM optical transmitters of the type illustrated in FIG. 4 and conventional optical receivers.

An example of an MWML-DWDM optical transmitter/receiver system using the MWML-DWDM optical transmitter of FIG. 4 or 5 in accordance with the invention is shown schematically in FIG. 11. As illustrated, an MWML-DWDM transmission system in accordance with the invention includes an MWML-DWDM optical transmitter 40 or 50, a single mode fiber span 110, and a conventional DWDM optical receiver 112. As described above, the MWML-DWDM optical transmitter 40 or 50 preferably comprises a WORP-DWDM optical source 20, a high-speed modulator 42 such as an electro-optic modulator, an optional etalon filter 46, and an ETDM/driver 48. In the illustrated SONET embodiment, the ETDM/driver 48 may be a 40 Gbit/sec 16:1 ETDM/driver which is responsive to 16 data inputs, such as STS-48 inputs. The DWDM SONET optical receiver 112, on the other hand, comprises a conventional DWDM filter 114, such as an arrayed waveguide grating (AWG) filter or an interference filter, which separates the DWDM optical data stream into its wavelength components for demodulation by 16 SONET receivers 116 which demodulate the optical data streams to provide 16 received electronic data stream outputs. In the example in FIG. 11, the inputs are SONET STS-48 electrical signals and the outputs are SONET STS-48 electrical signals that are transmitted in a SONET optical format over fiber 110. Although not shown in FIG. 11, appropriate control electronics/software, a craft interface, signaling systems, operations/administration/management systems, and electromechanical support are also provided. Of course, for a complete bidirectional transmission system, two links of the type illustrated in FIG. 11 would be required. Also, those skilled in the art will appreciate that systems with more or less than 16 wavelengths may be used.

Reception by MWML-DWDM pulsed optical receiver 112 of the DWDM signals generated by the MWML-DWDM optical transmitter 40 of the invention is in all respects similar to reception of standard WDM signals. This is because generated signals in a preferred embodiment are standard WDM signals, which use a RZ modulation scheme. However, an NRZ modulation scheme as described above could also be generated by the MWML-DWDM transmitter as desired.

Figure 12:
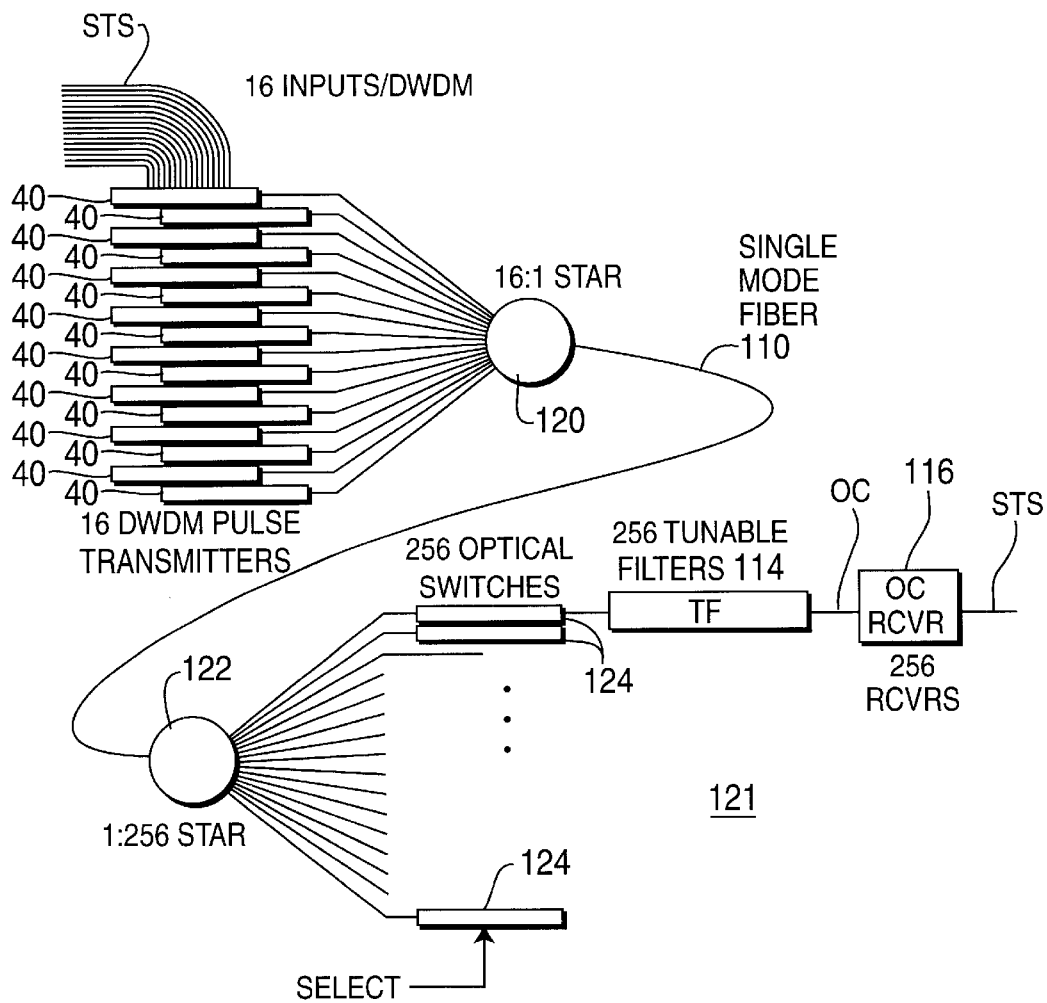
FIG. 12 is a schematic diagram of an embodiment of a MWML-DWDM-TDM optical transmission system including MWML-DWDM optical transmitters of the type illustrated in FIG. 9 and a MWML-DWDM-TDM receiver which separates the received signals by time and frequency.

MWML-DWDM-TDM Optical Transmission Systems Using MWML-DWDM-TDM Optical Transmitters An example of an MWML-DWDM-TDM pulsed optical transmitter/receiver system using the MWML-DWDM-TDM optical transmitter 90 (FIG. 9) in a SONET environment in accordance with the invention is illustrated in FIG. 12. In this embodiment, a conventional WDM receiver may not be used because of the TDM characteristics of the received signal. FIG. 12 illustrates a MWML-DWDM-TDM transmission system which includes 16 MWML-DWDM optical transmitters 40 with non-overlapping time shifted wavelength outputs, a 16:1 star combiner 120 which provides respective time slots for the non-overlapping time shifted pulses from the respective MWML-DWDM optical transmitters 40, a single-mode fiber span 110, and a MWML-DWDM-TDM optical receiver 121. In the embodiment of FIG. 12, after coding the data in MWML-DWDM transmitters 40, the MWML-DWDM-TDM format is impressed onto single optical fiber 110 by 16:1 star combiner 120 to provide a single data stream containing 256 channels (16 time slots by 16 wavelengths). In the example of each channel conveying 2.5 Gb/s digital optical data rates, such a system would convey 640 Gb/s of digital optical data. At the MWML-DWDM-TDM optical receiver 121, the single data stream is separated into 256 channels by 1:256 star optical separator 122, and each optical switch 124 selects a corresponding one of the 256 input channels by selecting the appropriate pulse-frame. The pulses in the selected pulse-frame are then provided to a corresponding DWDM filter 114, which may be a tunable filter, for tuning to the desired wavelength in the selected time slot or a fixed filter such as an arrayed waveguide grating (AWG) filter or other filter devices performing a similar function known to those skilled in the art, and pulses in the selected pulse-frame and the tuned frequency are provided to the corresponding optical receiver 116 for demodulation of the transmitted data As noted above, the optical switch 124 may be an electro-optic modulator or a nonlinear optical switch such as a TOAD device, or another device performing a similar function known to those skilled in the art.

The MWML-DWDM-TDM transmission technique of FIG. 12 provides a very good engineering trade-off between electronics and optics. The MWML-DWDM-TDM optical transmitters of FIG. 12 offer increased flexibility between electronics and optics due to the fact that TDM pulses are generated and that a TDM system approach may be used without the addition of TDM components on the transmitter side. While those skilled in the art will appreciate that the MWML-DWDM and MWML-DWDM-TDM optical transmitters of the invention do not offer any additional bandwidth to a single-mode fiber transmission system, those skilled in the art will appreciate that the techniques of the invention permit transmission of large quantities of data at a given rate to be achieved for a cheaper cost.

In the following sections, the system elements described above will be used to create network elements such as add-drop multiplexers and crossconnects.

DWDM Add-Drop Multiplexer Network Components

Key parts of the designs of MWML-DWDM and MWML-DWDM-TDM optical transmission systems of the type shown in FIGS. 11 and 12 are high-speed controllers and high-speed electronic multiplexers. These components maintain synchronization of the multiplexing process and allow functions such as add-drop multiplexing, grooming and other important features needed in modem backbone telecommunications networks.

A bi-directional add-drop multiplexer in accordance with the invention generally comprises two MWML-DWDM or MWML-DWDM-TDM optical transmitters, one or two optical fiber spans (unidirectional or bi-directional), two corresponding MWML-DWDM or MWML-DWDM-TDM receivers, control electronics/software, a craft interface, signaling systems, operations/administration/management systems, and electromechanical support. Certain signal lines are configured to pass through the system with amplification and possibly regeneration while others are configured to be added or deleted from the signal stream.

Figure 13:
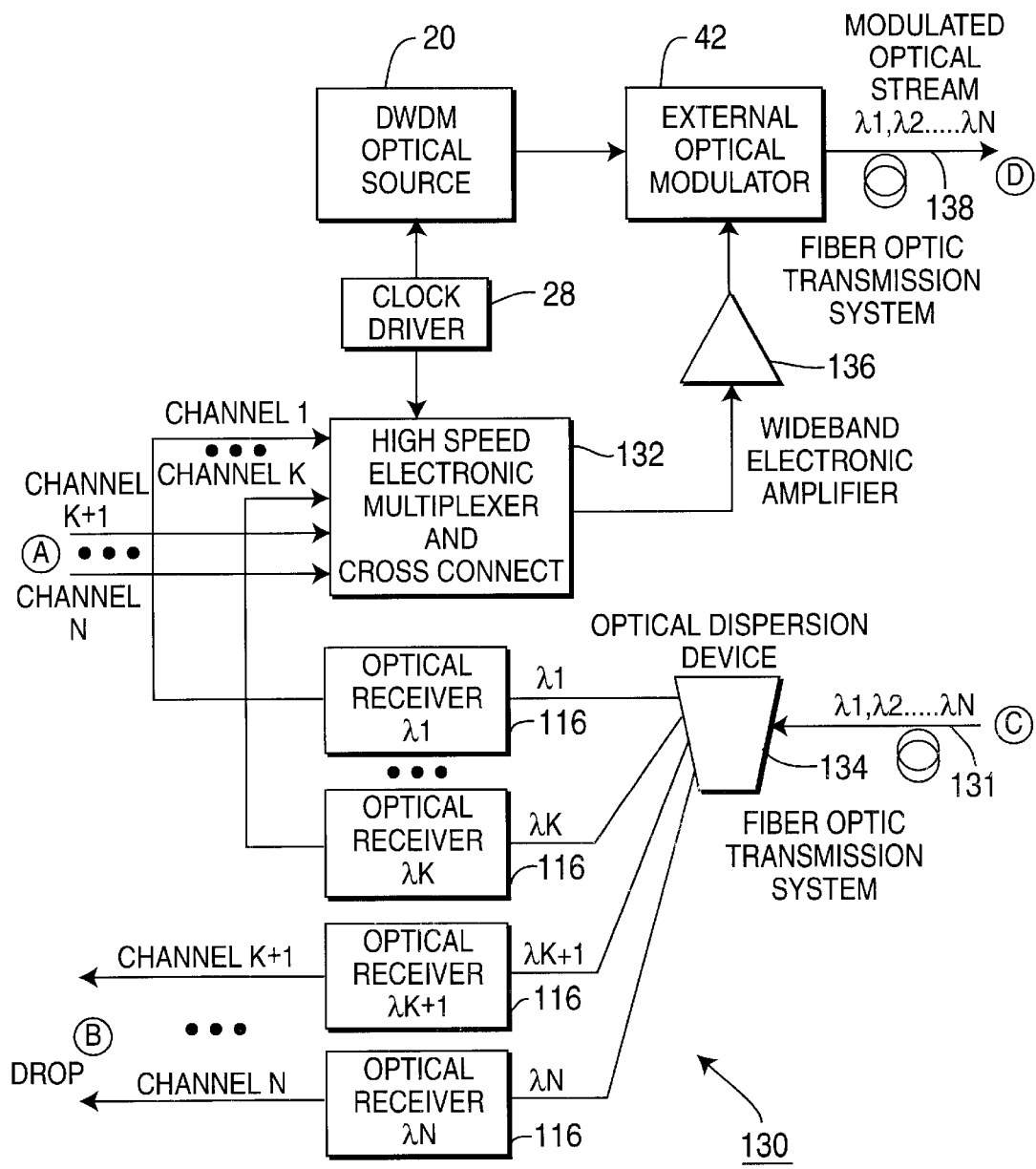
FIG. 13 is a schematic diagram of an embodiment of a MWML-DWDM optical crossconnect as an optical add-drop multiplexer in accordance with the invention.

In accordance with a preferred embodiment of the invention, the MWML-DWDM optical transmission system of FIG. 11 having a MWML semiconductor laser as its light source is used as an optical add-drop multiplexer 130 as shown in FIG. 13. A high speed electronic multiplexer and crossconnect 132 may be used to rearrange wavelengths received by the optical dispersion device 134 from optical fiber 131 and optical receivers 116 at the receiver side for output on the transmitter side after amplification by wideband electronic amplifier 136 and modulation onto a WORP-DWDM pulse stream by modulator 42. Received wavelength channels 1 through k are passed through the system and possibly rearranged to be extracted at the next MWML-DWDM crossconnect switch in the system architecture. On the other hand, channels k+1 through N may be dropped from the system or added as indicated. Optionally, an etalon may be added after modulator 42 to minimize dispersion before placing the data stream onto optical fiber 138.

In operation, add-drop multiplexer 130 converts the received wavelengths to baseband at optical receivers 116, remultiplexes the baseband data stream with the added K+1 through N signals at high speed electronic multiplexer and crossconnect 132, and inserts the remultiplexed modulated optical stream into optical fiber 138 at modulator 42. Those skilled in the art will appreciate that there is no requirement that a signal received (e.g., channel 2, $\lambda_2$) be remodulated on optical fiber 138 at the same wavelength $\lambda_2$. The assignment is arbitrary and hence provides great network flexibility.

Figure 14:
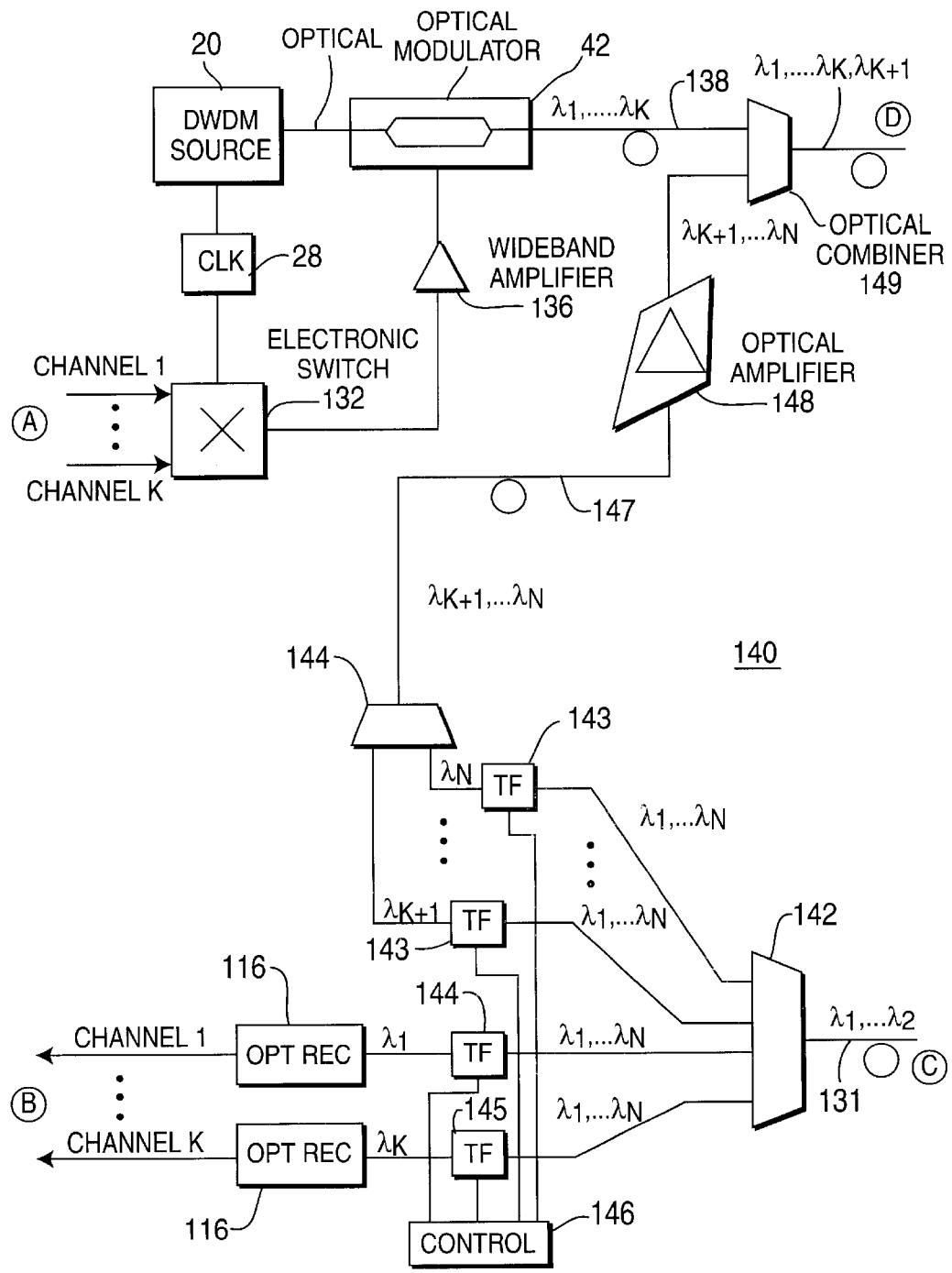
FIG. 14 is a schematic diagram of an alternate embodiment of an MWML-DWDM optical crossconnect as an optical add-drop multiplexer in which an all-optical passthrough is provided in accordance with the invention.

As known by those skilled in the art, the add-drop function works in a similar manner to a highway with express lanes and local lanes. Any data signal has to traverse from the pass through wavelengths (express lanes) to the local lanes (add-drop) for the signal to be extracted. An alternative add-drop architecture 140 is illustrated in FIG. 14 in which the passthrough (express lanes) stay in an all optical mode. In the FIG. 14 embodiment, the data received from optical fiber 131 is applied to an optical splitter 142 which copies the received stream and places it into several paths. The optical passthrough streams are applied to tunable filters 143 for wavelength selection under control of control circuit 146, and the selected wavelength signals in each passthrough path are applied to optical combiner 144. On the other hand, the optical streams in the drop paths are applied to tunable filters 145 for wavelength selection, and the selected wavelength signals are applied to optical receivers 116 for demodulation to baseband. The selected wavelength signals are then dropped. The passthrough data stream from optical combiner 144 is sent over optical fiber 147 for amplification by optical amplifier 148 and combination with the output of modulator 42 by optical combiner 149. This embodiment affords a smaller high speed electronic multiplexer and crossconnect 132 but does not provide for retiming. However, those skilled at the art will appreciate that a regeneration circuit (optical or electronic) could be easily added after the tunable filters 143 to provide such retiming.

Figure 15:
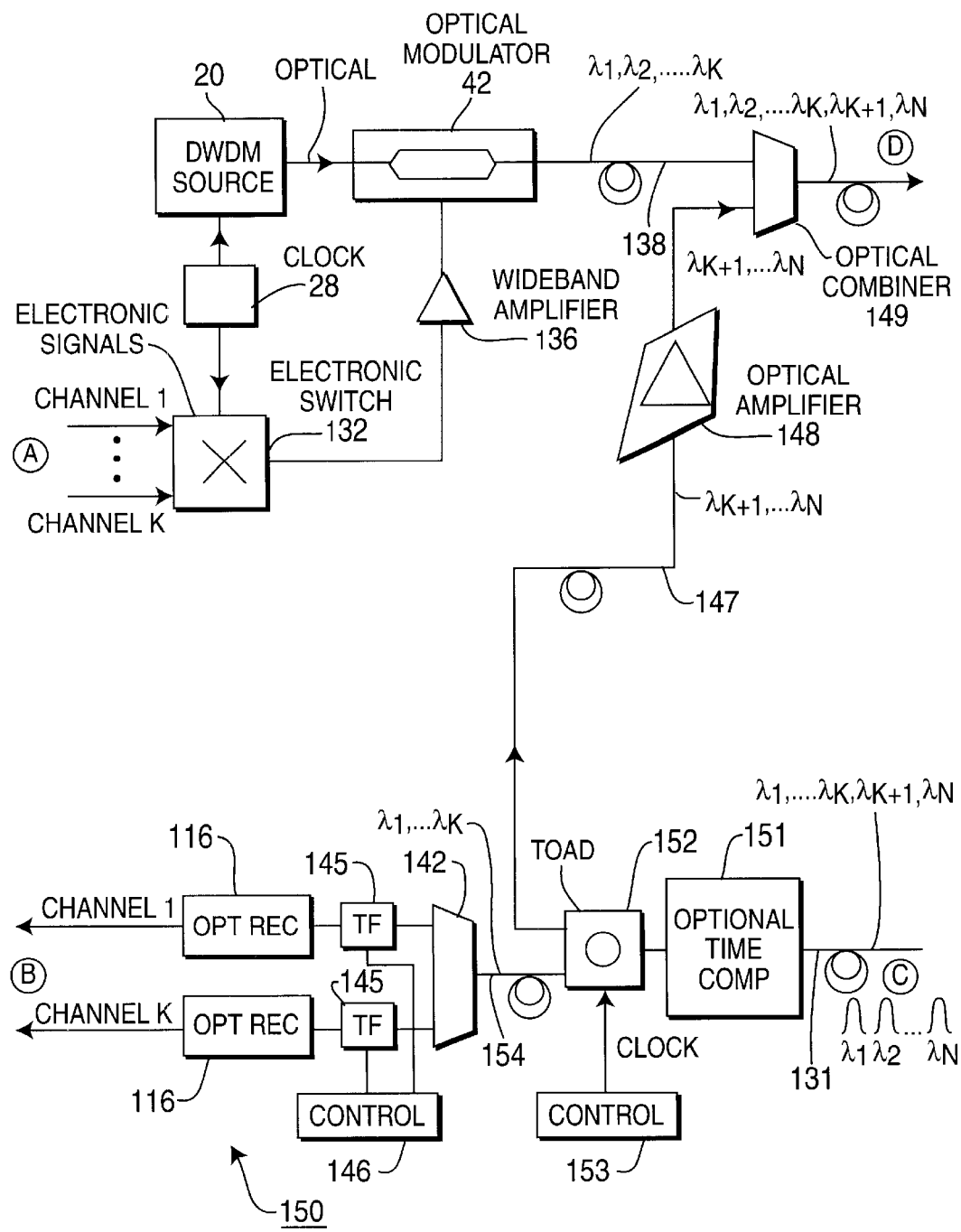
FIG. 15 is a schematic diagram of another alternative embodiment of an MWML-DWDM optical crossconnect as an optical add-drop multiplexer in which an all-optical passthrough is provided in accordance with the invention.

FIG. 15 is a schematic diagram of an alternative embodiment of a MWML-DWDM optical add-drop multiplexer 150 in which an all optical passthrough is provided. It is assumed that the plurality of optical channels traveling over optical fiber 131 is contained in a WORP-DWDM pulse sequence that has been possibly broadened due to fiber dispersion effects.

In the FIG. 15 embodiment, the drop path is the same as in the FIG. 14 embodiment. However, the tunable filters 143 and optical splitter 144 are replaced by an optical switch 152 that operates in the time domain. In particular, the received optical signal from optical fiber 131 is time compressed by optical time compression circuit 151 to minimize dispersion and applied to an optical switch 152 such as the Terahertz Optical Asymmetric Demultiplexer (TOAD) developed by Prucnal et al. of Princeton University. This switch is desirable because it provides switching at 25 psec or shorter time intervals. An example of the "TOAD" 152 in FIG. 15 is described in detail in U.S. Pat. No. 5,493,433 and functions to separate the passthrough "express" channels from the "local" channels using a TDM approach. In the FIG. 15 embodiment, a clock from a control circuit 153 is applied to TOAD 152 to direct the passthrough channels and the drop channels to their respective paths by selecting the appropriate pulses in the WORP sequence. In this embodiment, selection of the pulse is equivalent to selection of the wavelength and data channel. Those channels to be dropped are passed over optical fiber 154 to optical splitter 142 as in the embodiment of FIG. 14. The selected wavelengths are then dropped at the receivers 116. On the other hand, channels output by TOAD 152 to be passed through may be sent via fiber 147 and optical amplifier 148 for combination with the output of modulator 42 by optical combiner 149 for a completely optical pass-through.

Those skilled in the art will appreciate that the architecture of FIG. 15 may have a problem at changing wavelengths in the center of the network. However, the approach embodied in FIG. 15 is beneficial in that it reduces complexity of the electronic multiplexer structure, the passthrough channels stay in the optical domain, and the channels can be arbitrarily assigned to optical wavelengths and slot positions. While the system of FIG. 15 requires use of a TOAD type device 152 to separate signals using optical time domain technology, the TOAD device 152 could be replaced by other types of optical switches, such as $LiNbO_3$ directional coupler modulators. Those skilled in the art also could readily substitute an optical directional coupler for the TOAD device 152.

Figure 16:
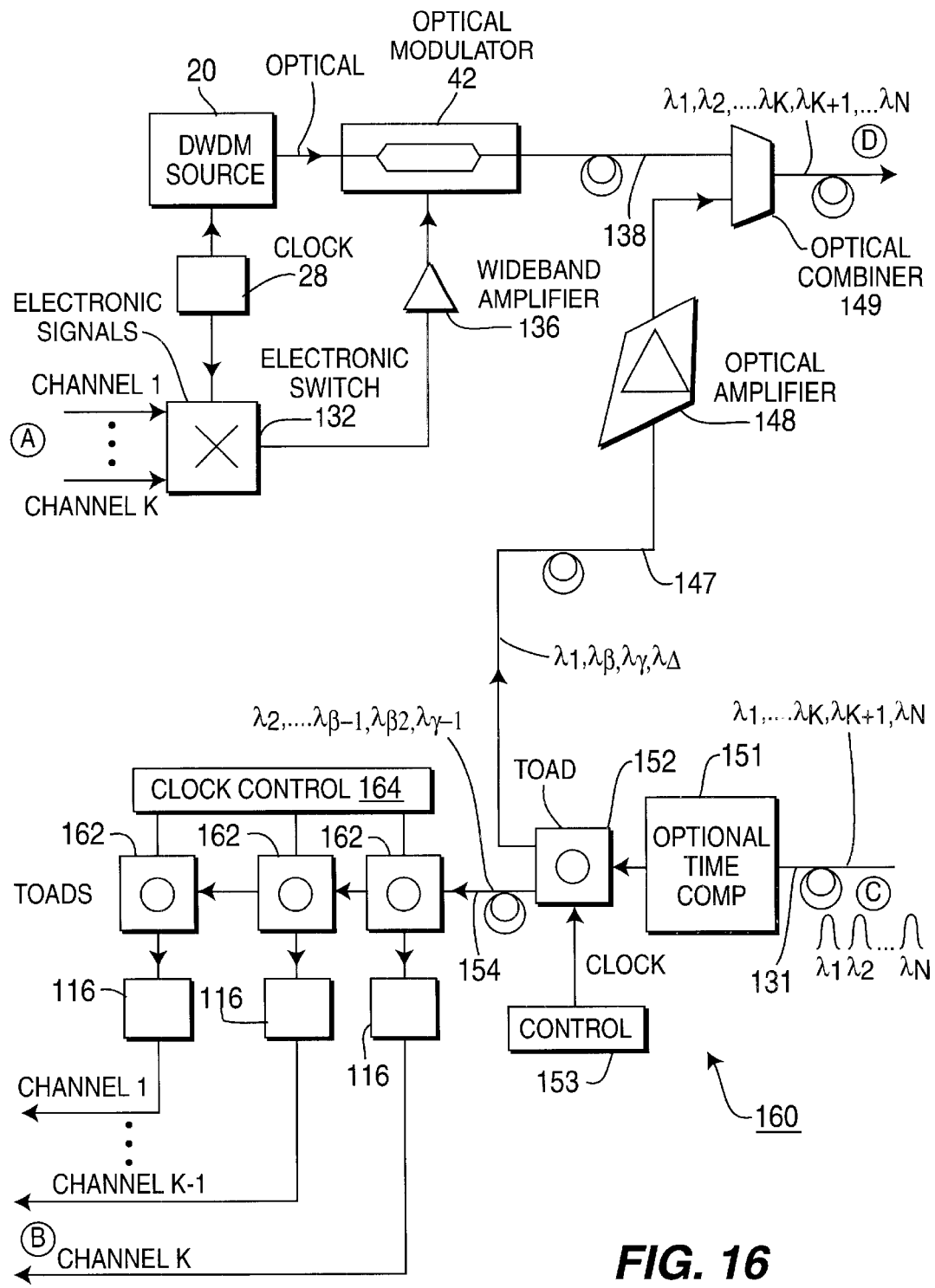
FIG. 16 is a schematic diagram of yet another alternative embodiment of an MWML-DWDM optical crossconnect as an optical add-drop multiplexer in which an all-optical passthrough is provided in accordance with the invention.

FIG. 16 is a schematic diagram of yet another alternative embodiment of an MWML-DWDM optical add-drop multiplexer 160 in which an all optical passthrough is provided It is assumed that the plurality of optical channels traveling over optical fiber 131 is contained in a WORP-DWDM pulse sequence that has been possibly broadened due to fiber dispersion effects.

In the FIG. 16 embodiment, the passthrough path is the same as in FIG. 15; however, the drop path is modified to replace the optical splitter 142 and tunable filters 145 with a plurality of TOADs 162 which select wavelengths in a TDM fashion under control of clock control circuiting 164. This embodiment is the complete TDM alternative to FIG. 15 and conceptually can extract arbitrary channels in the drop path much faster because of the performance advantage of optical switching over filter selection.

Figure 17:
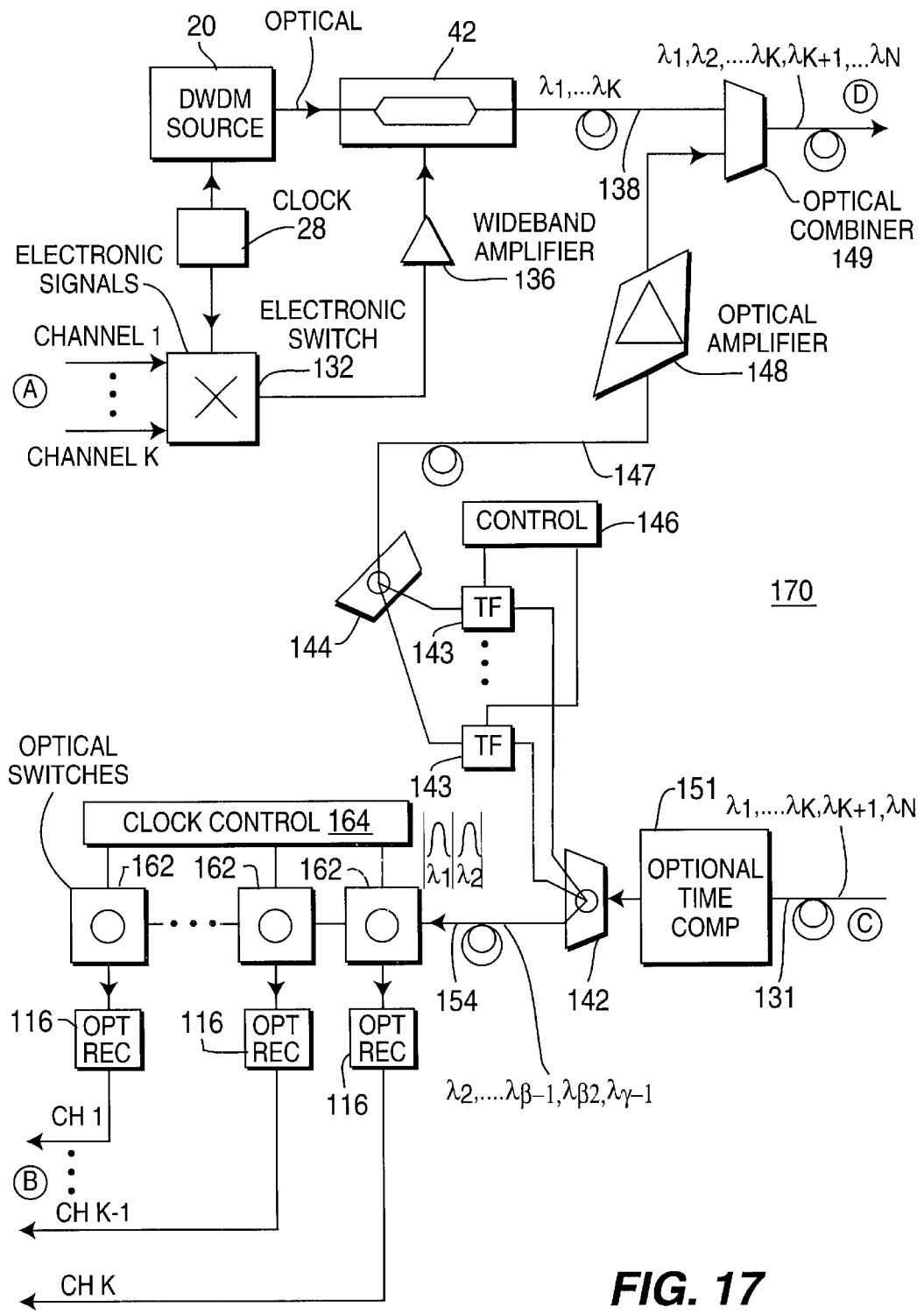
FIG. 17 is a schematic diagram of still another alternative embodiment of an MWML-DWDM optical crossconnect as an optical add-drop multiplexer in which an all-optical passthrough is provided in accordance with the invention.

FIG. 17 is a schematic diagram of still another alternative embodiment of an MWML-DWDM optical add-drop multiplexer 170 in which an all optical passthrough is provided. It is assumed that the plurality of optical channels traveling over optical fiber 131 is contained in a WORP-DWDM pulse sequence that has been possibly broadened due to fiber dispersion effects.

In the FIG. 17 embodiment, the passthrough path is the same as in FIG. 14 and the drop path is the same as in FIG. 16.

Those skilled in the are will appreciate that anetalon may be used after modulator 42 in each of the embodiments of FIGS. 14–17 to minimize pulse dispersion and overlap for transmission of WORP sequences in accordance with the invention.

Figure 18:
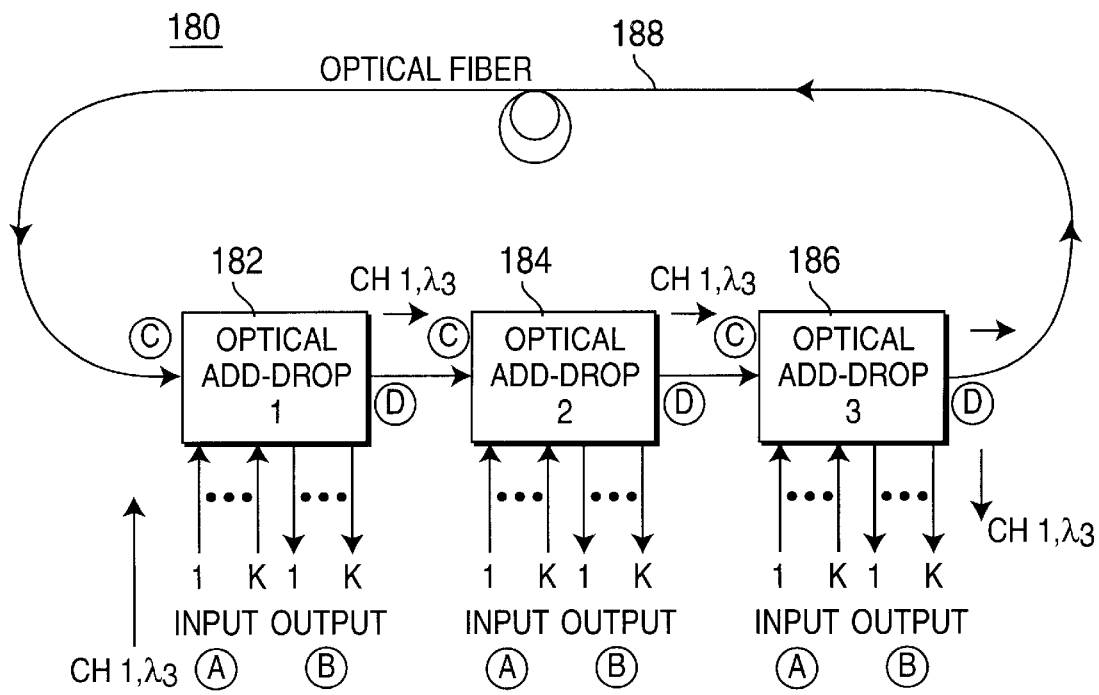
FIG. 18 is an optical add-drop ring configuration indicating how a data signal has to traverse from the passthrough wavelengths (express lanes) to the add-drop wavelengths (local lanes) in the prior switch for the signal to be extracted.

An example of an add-drop network implementing the add-drop elements of the type described above with respect to FIGS. 13–17 in a SONET ring configuration 180 with optical passthrough is shown in FIG. 18. In this embodiment, the add-drop multiplexer configuration of FIGS. 13–17 is used for the respective switches 182, 184, and 186. In the FIG. 18 example, switch 1 (182) injects Channel 1, $\lambda_3$; switch 2 (184) moves Channel 1, $\lambda_3$ across the switch 184 in the express lanes; and switch 3 (186) extracts Channel 1, $\lambda_3$ from the system prior to retransmission over optical fiber 188 in a SONET ring back to switch 1 (182) for a simplified network operation. In the example of FIG. 18, $\lambda_3$ is added at switch 1 (182) and dropped at switch 3 (186).

Figure 19:
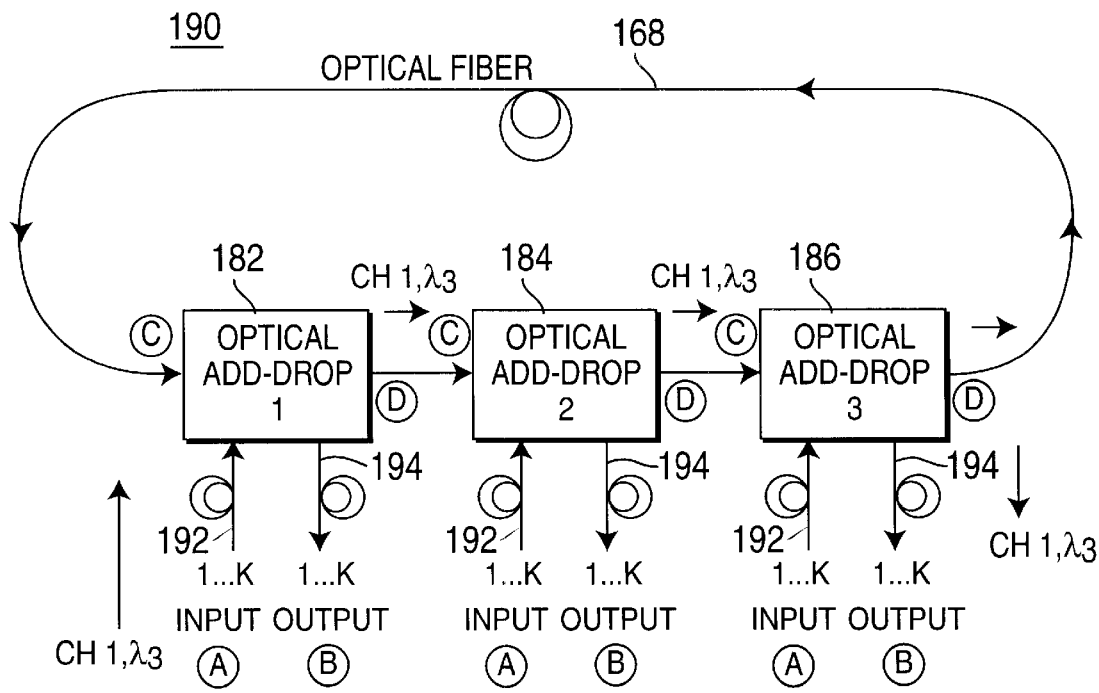
FIG. 19 is an optical add-drop configuration of an all-optical system of the type shown in FIG. 18.

FIG. 19 is a SONET ring configuration of an all-optical system 190 of the type shown in FIG. 18. This embodiment is the same as the FIG. 18 embodiment except that the signals to be added are provided via optical fiber 192 and are dropped via optical fiber 194. In this embodiment, the electronic inputs and outputs of electronic multiplexer and crossconnect 132 are replaced with optical inputs and outputs in accordance with the techniques of the invention.

Those skilled in the art will appreciate that the add-drop network configurations of FIGS. 13 and 14 are not limited to use with MWML-DWDM or MWML-DWDM-TDM optical transmitters of the type described above with respect to FIGS. 4, 5, 8, and 9. On the other hand, the add-drop network configurations of FIGS. 15–17 require the use of a WORP stream as defined herein and thus require transmitters of the type described herein. Add-drop network configurations of FIGS. 13 and 14 can be used interchangeably with equipment that generates conventional DWDM data streams.

DWDM Crossconnect Network Components

Figure 20:
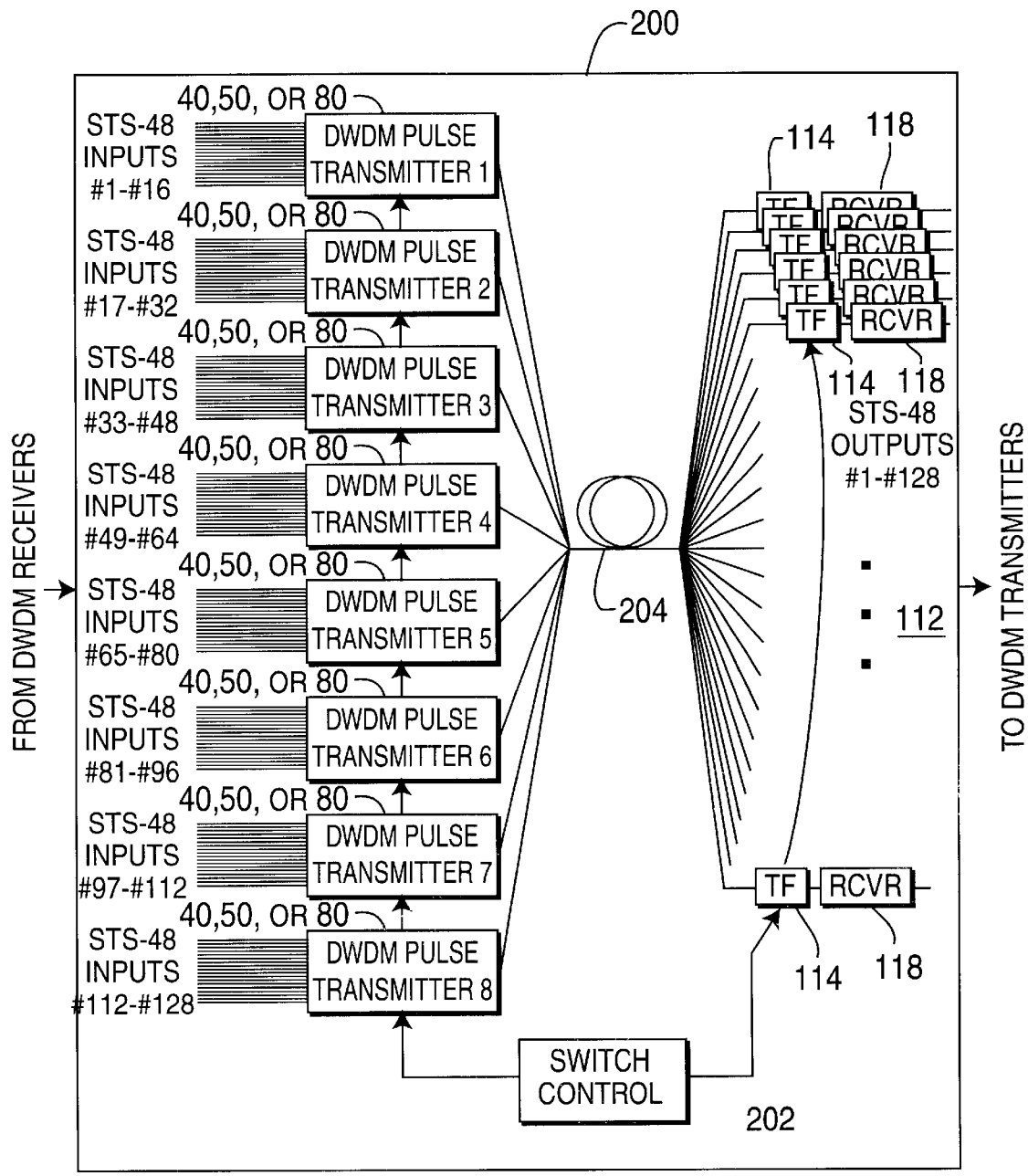
FIG. 20 is a generalized block diagram of an opticalcrossconnect using an MWML-DWDM optical transmitter of the type illustrated in FIGS. 4, 5, or 8.

FIG. 20 is a generalized block diagram of an opticalcrossconnect using an MWML-DWDM optical transmitter 40, 50, or 80 of the type illustrated in FIG. 4, 5, or 8. The crossconnect of FIG. 20 contains a fiber optic switch core for switching received electronic or optical signals. A bi-directional switching system implementing such a crossconnect generally comprises a plurality of such MWML-DWDM optical transmitters, one or two optical fiber spans, two sets of corresponding MWML-DWDM optical receivers, control electronics/software, a craft interface, signaling systems, operations/administration/management systems, and electromechanical support. In particular, FIG. 20 shows unidirectional optoelectronic components of a 128 ×128 SONET STS-48 switch 200 including MWML-DWDM optical transmitters 40, 50, or 80 of the type described above which are synchronized by switch control circuit 202. Tunable filters (TF) 114 receive the transmitted pulse stream from the fiber optic switch core 204 and select the desired wavelength pulses from the pulse stream under control of signals from switch control circuit 202 so as to select the individual channels broadcast on the fiber optic switch core 204 between the transmit and receive sides of the switch 200 for demodulation by receivers 116. In the embodiment of FIG. 20, 16 high speed data signals are input into each of eight MWML-DWDM pulsed optical transmitters 40, 50, or 80 which, in turn, generate 16 unique WORP sequences with nonoverlapping wavelengths within the switch system 200 using the techniques illustrated in FIG. 6($a$) or FIG. 6($b$). These WORP sequences are combined in an optical combiner where they enter the fiber optic switch core 204 and are separated by an optical splitter. In the preferred embodiment, a star coupler with delay performs the functions of the combiner, fiber core and splitter. In all, there are 128 wavelengths transmitted in the illustrated embodiment. Since the span of the fiber optic switch core 204 is short, there is no need for rare-earth doped fiber amplifiers. Consequently, the available bandwidth is not limited by the bandwidth of such amplifiers. This is a significant advantage because the bandwidth in the switch core 204 can be increased to substantially larger portions of the spectrum than is possible to pass through an optical amplifier, thereby enabling much larger switches to be constructed.

To function as a fiber optic crossconnect or switch, optical receivers 116 are included at each transmitter input of the switch 200 shown at the left of FIG. 20, and conventional optical transmitters or MWML-DWDM optical transmitters 40, 50, or 80 are included at the output of the receivers 116 at the right of FIG. 20. The inputs at the left of FIG. 20 can be configured to accept DWDM inputs and transmit DWDM outputs so as to provide a true DWDM crossconnect switch, depending on the selection of SONET receivers at the input side and SONET transmitters at the output side of FIG. 20. The capacity of such a switch can be increased significantly beyond 128×128 and is not meant to be limited to any particular size by the description given herein. In practice, the maximum size may be determined by the optical link loss from MWML-DWDM optical transmitter 40, 50, or 80 to receiver 116 which is determined by the splitting losses going into, and out of, the fiber optic switch core 204. In any case, such losses can be compensated by increasing the power transmitted by each MWML-DWDM optical transmitter 40, 50, or 80 to permit switching of many channels. The data rates could be the SONET rates (OC-3 (155 Mbps), OC-12 (622 Mbps), OC-48 (2.48 Gbps), OC-192 (9.95 Gbps)), Ethernet, 10 base-T Ethernet, 100 base-T Ethernet, FDDI, ESCON, HIPPI, or other high-speed data rates.

By reading packet data on headers traveling through the switch 200 of FIG. 20 in a conventional fashion, it is possible to dynamically re-route the data The switch core 204 can be configured to provide microseconds of delay during which electronic switching determinations such as packet addressing and path routing can be made. In the case where additional delay may be required to accommodate larger packet lengths or packet lengths of varying or undetermined sizes, multiple or tandem fiber core sections may be cascaded or concatenated to achieve the needed length. A crossconnect of this type can form the basis of an asynchronous transfer mode (ATM) switch (or router) in which virtual circuits are established, as taught by Arthurs et al. in U.S. Pat. Nos. 4,873,686 and 5,005,167, and subsequently taught by Hamel in U.S. Pat. No. 5,506,710 and Guillemot et al. in U.S. Pat. No. 5,734,486. Those skilled in the art will appreciate that mixed systems architectures such as SONET, ATM, and Frame Relay may all be accommodated simultaneously or separately, as desired and provisioned.

DWDM-TDM Crossconnect Network Components

Figure 21:
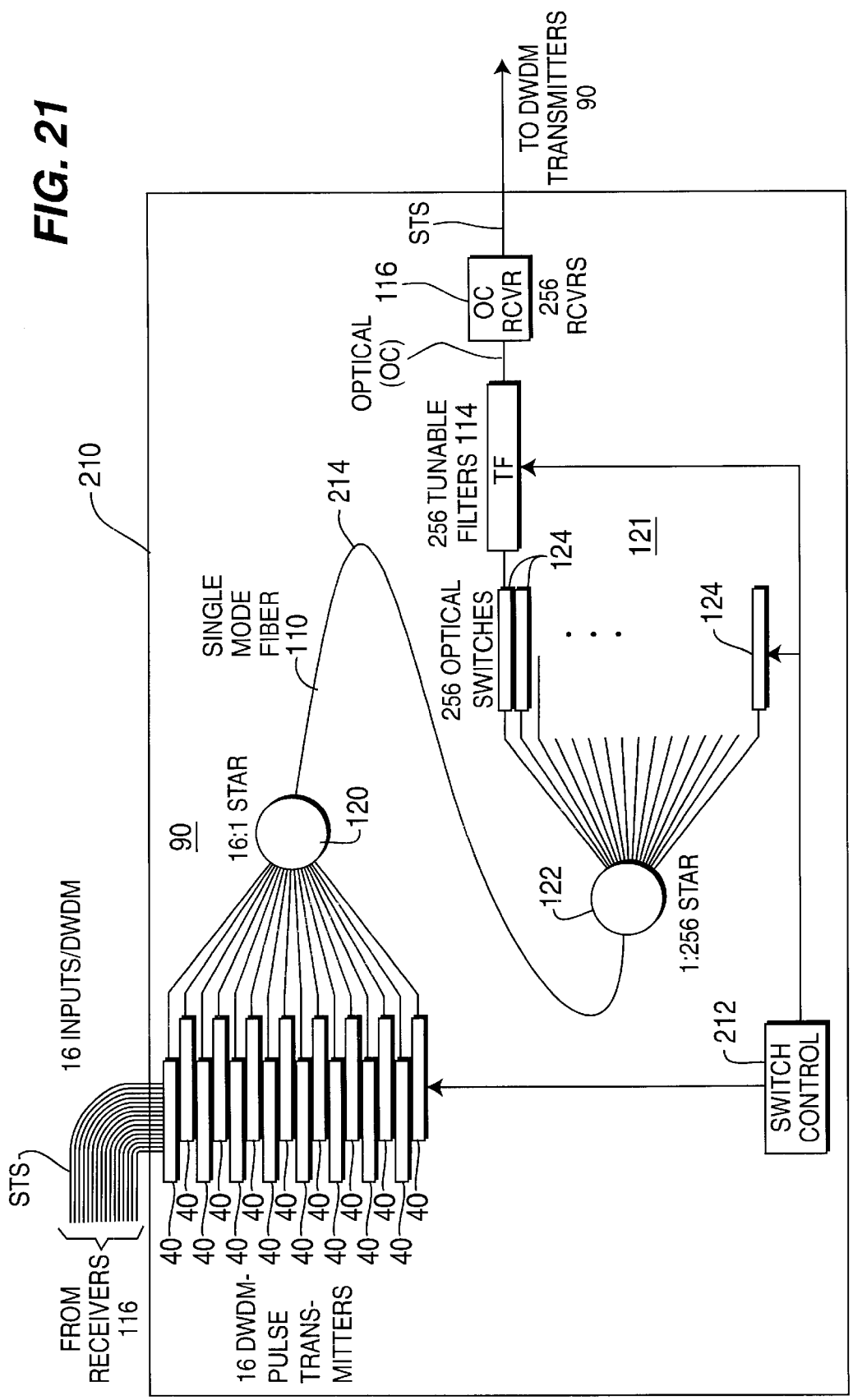
FIG. 21 is a generalized block diagram of an opticalcrossconnect using an MWML-DWDM-TDM optical transmitter of the type illustrated in FIG. 9.

FIG. 21 is a generalized block diagram of an opticalcrossconnect switch 210 using an MWML-DWDM-TDM optical transmitter 90 and receiver 121 of the type illustrated in FIG. 12. The crossconnect of FIG. 21 also contains a fiber optic switch core for switching received electronic or optical signals. As illustrated, the architecture of MWML-DWDM-TDM optical crossconnect 210 is similar to that of FIG. 20 with the exception of the addition of one optical switch 124 to each optical output channel to select the time slot in conjunction with a tunable filter 114 to select the wavelength for the optical receiver 116. In the illustrated embodiment, sixteen input lines each carrying SONET STS-48 data rates are input to each of the 16 MWML-DWDM optical transmitters 40 or 50 of the MWML-DWDM-TDM optical transmitter 90. Although not explicitly shown in FIG. 21, a single MWML-DWDM laser source may be employed for all 16 MWML-DWDM optical transmitters 40, i.e., for all 256 input channels, amplified, distributed, and delayed as required, to create a constellation of time-frequency channel-states shown schematically in FIG. 22, where each element of the matrix represents a single data stream or time-frequency channel-state.

As illustrated in FIG. 21, the MWML-DWDM optical transmitters 40 or 50 are synchronized by switch control/clock synchronization circuit 212 during coding. After coding of the data at MWML-DWDM optical transmitters 40 or 50, the MWML-DWDM-TDM format is impressed onto the switch core optical fiber 214 by a 16:1 star combiner 120. At the receiver 121, the single data stream is separated into 256 channels by 1:256 star optical separator 122 with delay, and each of 256 time slots is selected by using optical switches 124 to select the time slot channel. Any one of the 256 input frequency channels is then selected by tuning the desired wavelength using tunable filters 114 such as arrayed waveguide grating (AWG) filters under control of switch control 212. AWG filters 114 select the desired frequency by tuning to the proper time slot using optical switches 124 to select the time slot channel. In other words, selection of the proper channel requires the specification of the frequency of interest as well as the proper time slot, in either order.

Those skilled in the art will appreciate that, for shorter pulses, the optical carriers need to be spaced more widely in the wavelength domain. This is because the optical bandwidth is inversely proportional to pulse duration. In addition, for transmission applications it is necessary to take into account dispersion. However, the use of an etalon filter 46 to decrease bandwidth, as taught above for MWML-DWDM optical transmission system architecture, is not applied to MWML-DWDM-TDM systems because of the need to preserve time registration of each pulse at the receiver. Fortunately, for switching purposes, dispersion is of less importance because the total distance traveled is short within the system Even with the addition of a fiber delay of 1 msec to permit packet header reading and dynamic routing, the dispersion is minimal. However, dispersion for transmission applications needs to be compensated or reduced though the use of low dispersion fiber designs such as the Corning LEAF™ fiber.

Figure 22:
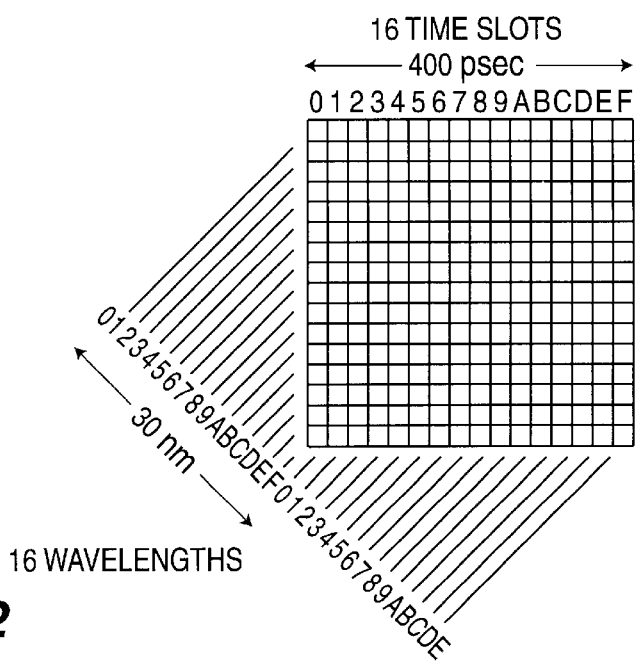
FIG. 22 is a grid showing how individual data streams may be selected using a combination of WDM and TDM switching in the optical crossconnect embodiment of FIG. 21.

As noted above, individual data streams within the MWML-DWDM-TDM switching constellation, an example of which is shown in FIG. 22, can be selected using a combination of WDM and TDM switching. The latter approach is used in the design illustrated in FIG. 21. However, it is possible to select individual data streams using a dual TDM switching approach without the use of WDM switching at all. Those skilled in the art will appreciate that there may be certain advantages to using a dual TDM approach pertaining to the relative economics of using data selection of one type, i.e., TDM, rather than mixing TDM and WDM.

As illustrated in FIG. 22, a single column can be isolated by means of a time domain switch in a manner identical to that represented by FIG. 21. Once all other columns are isolated, reverse dispersion may be applied to the remaining data streams. In effect, this undoes the dispersion represented by FIG. 3(b) that was originally used to spread out the simultaneous pulses emitted by the MWML laser source 22 to a WORP sequence as required by the MWML-DWDM and MWML-DWDM-TDM systems of the invention. At this time, each data stream in the column selected by the first time domain switch is retimed to occur in a unique time interval. Following this operation, any one data stream may be selected by means of a subsequent time-domain switch.

Figure 23:
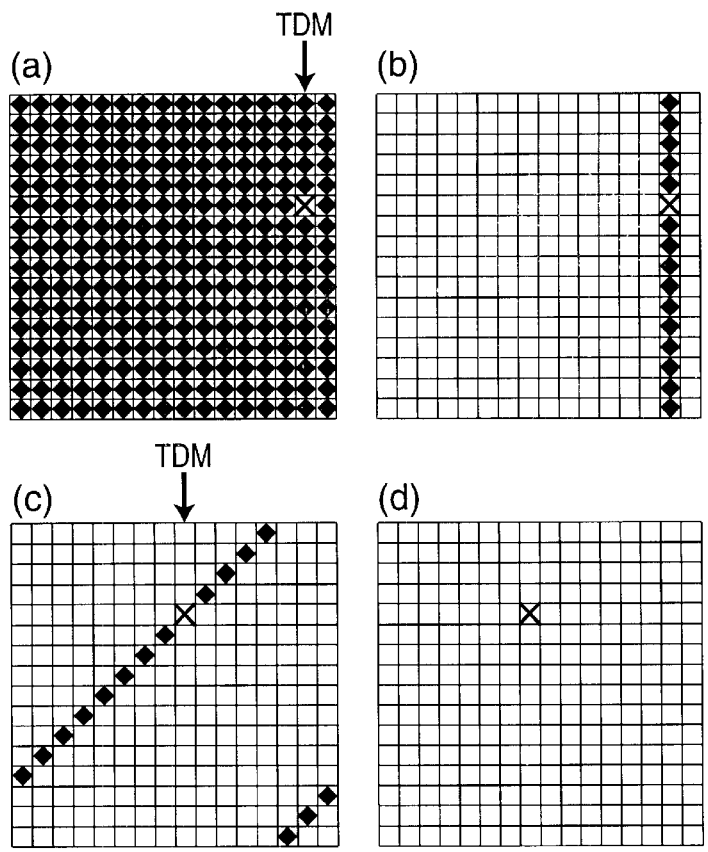
FIG. 23(a) illustrates the grid of FIG. 22 populated with 256 data streams.
FIG. 23(b) illustrates the use of TDM switching to select one column of 16 states of the grid of FIG. 23(a).
FIG. 23(c) illustrates the use of dispersion to achieve a delay that is different for each individual data stream in the selected column of FIG. 23(b).
FIG. 23(d) illustrates the use of a second TDM switching function applied to the grid of FIG. 23(c) to select a single data stream for reception by, e.g., a SONET receiver.

This process is shown schematically by FIG. 23 in which the states diagram introduced in FIG. 22 is used for clarity. FIG. 23(a) illustrates a populated constellation consisting of 256 data streams. The first operation of TDM switching selects one column of 16 states as depicted by FIG. 23(b). Since each column contains no more than one instance of any given wavelength, dispersion can be used to achieve a delay which is different for each individual data stream in the selected column, resulting in the diagram shown in FIG. 23(c). By application of the second TDM switching function to the constellation of FIG. 23(c), a single data stream is selected, as represented by FIG. 23(d). This single data stream, selected from among 256 data streams, can be received by, e.g., a SONET receiver 116.

As noted above, the advantage of using such a complete TDM approach is switching speed.

In accordance with the invention, the simplest configuration of the optical crossconnect of FIG. 21 passes the selected wavelengths directly to the output (i.e., receiver elements 114, 116, and 124 are not used), possibly passing through an optical etalon filter to spread the pulses in the WORP sequence for transmission to the next network element. This approach has the advantage of simplicity with the least parts count. This embodiment has applications in campus local area networks, metropolitan area networks, and other short haul applications. However, this approach places a demand that the wavelength-time slot on the transmitter side has to be selected and controlled via the switch controller 212, for the selected wavelength will be the wavelength used in the output time slot to select the physical port.

It is to be understood that the apparatus and method of operation taught herein are illustrative of the invention. Modifications may readily be devised by those skilled in the art without departing from the spirit or scope of the invention. For example, the optimum period of MWML pulses may be significantly longer than the rate required by the DWDM optical transmission system. In such a case, longer period pulses may be interleaved to achieve shorter periods by methods known to those skilled in the art. In addition, those skilled in the art will appreciate that a plurality of the MWML-DWDM and MWML-DWDM-TDM pulsed optical transmission systems described herein may be combined to include additional frequencies and/or time slots. All such modifications are intended to be included within the scope of the appended claims.

We claim:

1. A network element for use in a dense wavelength division multiplexed (DWDM) network, said network element receiving a first plurality of signals at at least one input port on an input side and emitting a second plurality of signals at at least one output port on an output side, said network element comprising:

at least one optical receiver which receives said first plurality of signals on said input side at said at least one input port and demodulates digital data from at least one designated wavelength of said first plurality of signals;

a multiwavelength optical source which emits wavelength ordered repetitive periodic (WORP) pulse sequences within a plurality of discrete wavelength bands simultaneously at a port thereof; and at least one modulator which receives said WORP pulse sequences from said multiwavelength optical source and modulates said digital data from said at least one designated wavelength onto selected wavelengths of a WORP pulse sequence from said multiwavelength optical source so as to create said second plurality of signals as a WORP sequence, whereby each output port contains a multiplicity of data channels each of which is assigned a unique wavelength from said WORP pulse sequences.

2. A network element as in claim 1, wherein said multiwavelength optical source comprises a multiwavelength mode-locked (MWML) laser including a semiconductor optical amplifier which is actively driven by a radio frequency signal to emit periodic pulses at a plurality of wavelengths simultaneously at a port of said amplifier, where the radio frequency signal has one of a fundamental frequency and harmonics of said radio frequency signal that substantially equals the inverse of a round trip travel time of pulses circulating within a cavity of said MWML laser.

3. A network element as in claim 2, where in said multiwavelength optical source further comprises a temporal dispersion element which time shifts said plurality of wavelengths by differential wavelength-dependent delays so as to transform pulses output by said MWML laser into said WORP sequences for application to said at least one modulator.

4. A network element as in claim 1, further comprising a multiplexer responsive to demodulated outputs of certain of said optical receivers to selectively apply said demodulated outputs to said at least one modulator for modulation.

5. An optical add/drop multiplexer for use in a dense wavelength division multiplexed (DWDM) optical network comprising a plurality of network elements connected by optical fiber, said add/drop multiplexer receiving input optical signals from said DWDM optical network at a first plurality of input ports and input signals at a second plurality of input ports for insertion into said DWDM optical network, and emitting output optical signals to said DWDM optical network at a first plurality of output ports and emitting output signals at a second plurality of output ports for removing from said DWDM optical network, said add/drop multiplexer comprising:

at least one optical receiver which receives said input optical signals from said optical network at said first plurality of input ports and demodulates digital data from at least one designated wavelength of said input optical signals;

a multiwavelength optical source which emits wavelength ordered repetitive periodic (WORP) pulse sequences within a plurality of discrete wavelength bands simultaneously at a port thereof; and at least one modulator which receives said WORP pulse sequences from said multiwavelength optical source and modulates said digital data from said at least one designated wavelength onto selected wavelengths of a WORP pulse sequence from said multiwavelength optical source so as to create said output optical signals as a WORP sequence for application to said network, whereby said first plurality of output ports contains a multiplicity of optical data channels each of which is assigned a unique wavelength from said WORP pulse sequences.

6. An optical add/drop multiplexer as in claim 5, further comprising first and second sets of optical receivers and at least optical dispersion device connected to said first plurality of input ports which separates said input optical signals into a first set of wavelengths for application to said first set of optical receivers having outputs connected to said second plurality of output ports and into a second set of wavelengths for application to said second set of optical receivers having outputs connected to said at least one modulator for modulation.

7. An add/drop multiplexer as in claim 6, further comprising a multiplexer responsive to said outputs of said second set of optical receivers and to said input signals received at said second plurality of input ports to selectively apply the outputs of said second set of optical receivers and said input signals received at said second plurality of input ports to said at least one modulator for modulation.

8. An add/drop multiplexer as in claim 5, further comprising an optical splitter connected to said first plurality of input ports which applies said input optical signals to a first plurality of filters for selection of which of said input optical signals to output as said output optical signals and which applies said input optical signals to a second plurality of filters for selection of which of said input optical signals to output as said output signals at said second plurality of output ports.

9. An add/drop multiplexer as in claim 8, wherein outputs of said second plurality of filters are optically combined with a WORP sequence output by said at least one modulator.

10. An add/drop multiplexer as in claim 5, further comprising an optical switch connected to said first plurality of input ports which selects a first set of pulses in WORP sequences in said input optical signals to output as said output signals at said second plurality of output ports and selects a second set of pulses in WORP sequences in said input optical signals to output as said output optical signals.

11. An add/drop multiplexer as in claim 10, wherein said second set of pulses in WORP sequences are optically combined with a WORP sequence output by said at least one modulator.

12. An add/drop multiplexer as in claim 11, wherein said first set of pulses in WORP sequences are applied to a plurality of filters for selection of which pulses in said second set of pulses in WORP sequences to output as said output signals at said second plurality of output ports.

13. An add/drop multiplexer as in claim 11, wherein said first set of pulses in WORP sequences are applied to a plurality of optical switches for selection of which pulses to output as said output signals at said second plurality of output ports.

14. An add/drop multiplexer as in claim 5, further comprising an optical splitter connected to said first plurality of input ports which applies said input optical signals to a plurality of filters for selection of which of said input optical signals to output as said output optical signals and which applies said input optical signals to a plurality of optical switches for selection of which of said input optical signals to output as said output signals at said second plurality of output ports.

15. An add/drop multiplexer as in claim 5, wherein said second plurality of input ports and said second plurality of output ports are optical ports connected to optical fibers.

16. A crossconnect with an optical fiber switch core, said crossconnect receiving a first plurality of data signals at input ports on an input side and providing a second plurality of data signals at output ports on an output side, said crossconnect comprising:

a switching control element that outputs a selection signal;

a multiwavelength optical source which emits wavelength ordered repetitive periodic (WORP) pulse sequences within a plurality of discrete wavelength bands simultaneously at a port thereof; and at least one modulator which receives said WORP pulse sequences from said multiwavelength optical source and modulates said first plurality of data signals from said input ports onto selected wavelengths of a WORP pulse sequence from said multiwavelength optical source so as to create a modulated WORP pulse sequence for transmission over said optical fiber switch core, said modulated WORP pulse sequence containing a multiplicity of optical data channels each of which is assigned a unique wavelength from said WORP pulse sequence; and at least one optical receiver which demodulates digital data from wavelengths in said modulated WORP pulse sequence as selected by said selection signal and provides said digital data as said second plurality of data signals to said output ports.

17. A crossconnect as in claim 16, wherein said multiwavelength optical source comprises a multiwavelength mode-locked (MWML) laser including a semiconductor optical amplifier which is actively driven by a radio frequency signal to emit periodic pulses at a plurality of wavelengths simultaneously at a port of said amplifier, where the radio frequency signal has one of a fundamental frequency and harmonics of said radio frequency signal that substantially equals the inverse of a round trip travel time of pulses circulating within a cavity of said MWML laser.

18. A crossconnect as in claim 17, wherein said multiwavelength optical source further comprises a temporal dispersion element which time shifts said plurality of wavelengths by differential wavelength-dependent delays so as to transform pulses output by said MWML laser into said WORP sequences for application to said at least one modulator.

19. An optical crossconnect as in claim 16, further comprising a star coupler which connects said at least one modulator to said at least one receiver, said star coupler including said optical fiber switch core.

20. An optical crossconnect as in claim 19, wherein said star coupler includes a delay sufficient to permit packet addressing and path routing before said output of said second plurality of data signals.

21. An optical crossconnect as in claim 16, further comprising a tunable filter for each optical receiver which selects a wave length in said modulated WORP pulse sequence for a corresponding optical receiver.

22. An optical crossconnect as in claim 21, wherein said at least one modulator includes an electronic time division multiplexer which modulates said first plurality of data signals onto selected pulses of WORP pulse sequences from said multiwavelength optical source in selected time slots, said optical crossconnect further comprising a time slot selection device for each optical receiver which selects, under control of said selection signal, a time slot in said modulated WORP pulse sequence for demodulation of a pulse of said WORP pulse sequence occurring in said selected time slot by a corresponding optical receiver.

23. A method of converting a first plurality of signals at at least one input port on an input side of a network element in a dense wavelength division multiplexed (DWDM) network into a second plurality of signals at at least one output port on an output side of said network element, comprising the steps of:

receiving said first plurality of signals on said input side at said at least one input port and demodulating digital data from at least one designated wavelength of said first plurality of signals;

generating wavelength ordered repetitive periodic (WORP) pulse sequences within a plurality of discrete wavelength bands simultaneously;

modulating said digital data from said at least one designated wavelength onto selected wavelengths of a WORP pulse sequence generated in said generating step so as to create said second plurality of signals as a WORP sequence at said at least one output port on said output side, each output port containing a multiplicity of data channels each of which is assigned a unique wavelength from said WORP pulse sequence.

24. A method as in claim 23, comprising the further step of separating said first plurality of signals into signals to be dropped from said DWDM network and signals to be passed through said DWDM network, said signals to be passed through being demodulated in said receiving and demodulating step.

25. A method as in claim 24, wherein said receiving step comprises the step of receiving signals to be added to said DWDM network for modulation in said modulation step.

26. A method as in claim 24, wherein said separating step comprises the step of applying said first plurality signals to at least one filter for selection of which of said first plurality of signals to pass through to said DWDM network.

27. A method as in claim 24, wherein said separating step comprises the step of applying said first plurality of signals to an optical switch for selection of which of said first plurality of signals to pass through to said DWDM network.

28. A method as in claim 24, comprising the further step of optically combining said signals to be passed through to said DWDM network with said second plurality of signals.

29. A method of assigning a first data signal at a first wavelength to a second wavelength using a crossconnect with a fiber optic switch core, comprising the steps of:

modulating said first data signal onto at least one selected wavelength of a wavelength ordered repetitive periodic (WORP) pulse sequence emitted by a multiwavelength optical source so as to create a modulated WORP pulse sequence;

transmitting said modulated WORP pulse sequence over said optical fiber switch core, said modulated WORP pulse sequence containing a multiplicity of optical data channels each of which is assigned a unique wavelength from said WORP pulse sequence;

demodulating said first data signal from wavelengths in said modulated WORP pulse sequence as selected by a selection signal; and modulating said demodulated first data signal at said second wavelength for retransmission.

30. A method as in claim 29, wherein said modulating step comprises the step of modulating said first data signal onto selected pulses of WORP pulse sequences from said multi-wavelength optical source in selected time slots, and said demodulating step comprises the step of selecting a time slot in said modulated WORP pulse sequence for demodulation of a pulse of said WORP pulse sequence occurring in said selected time slot.

* * * * *